US009090969B2

(12) United States Patent
Takeda et al.

(10) Patent No.: US 9,090,969 B2
(45) Date of Patent: Jul. 28, 2015

(54) SEMICONDUCTOR DEVICE MANUFACTURING AND PROCESSING METHODS AND APPARATUSES FOR FORMING A FILM

(75) Inventors: Tsuyoshi Takeda, Toyama (JP); Taketoshi Sato, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 274 days.

(21) Appl. No.: 13/529,373

(22) Filed: Jun. 21, 2012

(65) Prior Publication Data

US 2012/0329286 A1   Dec. 27, 2012

(30) Foreign Application Priority Data

Jun. 22, 2011 (JP) ................................. 2011-138471
May 22, 2012 (JP) ................................. 2012-116772

(51) Int. Cl.
| | |
|---|---|
| H01R 11/01 | (2006.01) |
| C23C 16/30 | (2006.01) |
| C23C 16/32 | (2006.01) |
| C23C 16/36 | (2006.01) |
| C23C 16/44 | (2006.01) |
| C23C 16/455 | (2006.01) |
| H01L 21/02 | (2006.01) |

(52) U.S. Cl.
CPC ............. *C23C 16/30* (2013.01); *C23C 16/325* (2013.01); *C23C 16/36* (2013.01); *C23C 16/4412* (2013.01); *C23C 16/45523* (2013.01); *H01L 21/0228* (2013.01); *H01L 21/02126* (2013.01); *H01L 21/02167* (2013.01); *H01L 21/02211* (2013.01)

(58) Field of Classification Search
CPC ........ H01L 21/312; C23C 16/52; C23C 16/32
USPC .............. 438/781; 118/697, 724; 257/E21.26
See application file for complete search history.

(56) References Cited

U.S. PATENT DOCUMENTS

| | | | |
|---|---|---|---|
| 8,486,191 B2 * | 7/2013 | Aggarwal et al. ............. | 118/715 |
| 2005/0287747 A1 | 12/2005 | Chakravarti et al. | |
| 2006/0138566 A1 | 6/2006 | Chakravarti et al. | |
| 2006/0237846 A1 | 10/2006 | Chakravarti et al. | |
| 2006/0286774 A1 * | 12/2006 | Singh et al. .................... | 438/478 |
| 2006/0286775 A1 * | 12/2006 | Singh et al. .................... | 438/478 |
| 2006/0286776 A1 * | 12/2006 | Ranish et al. .................. | 438/478 |
| 2008/0054228 A1 | 3/2008 | Chakravarti et al. | |

(Continued)

FOREIGN PATENT DOCUMENTS

| | | |
|---|---|---|
| JP | A-2001-358137 | 12/2001 |
| JP | A-2002-270606 | 9/2002 |

(Continued)

*Primary Examiner* — Caleb Henry
(74) *Attorney, Agent, or Firm* — Oliff PLC

(57) ABSTRACT

A semiconductor device manufacturing method includes: accommodating a substrate in a processing chamber; and supplying a silicon-based gas and an amine-based gas into the processing chamber that is heated to form a film including silicon and carbon on the substrate. The forming of the film including silicon and carbon includes: supplying the silicon-based gas and the amine-based gas into the processing chamber and confining the silicon-based gas and the amine-based gas in the processing chamber; maintaining a state in which the silicon-based gas and the amine-based gas are confined in the processing chamber, and exhausting an inside of the processing chamber.

16 Claims, 9 Drawing Sheets

(56) References Cited

U.S. PATENT DOCUMENTS

| | | | |
|---|---|---|---|
| 2009/0004363 A1* | 1/2009 | Keshner et al. | 427/8 |
| 2009/0117752 A1* | 5/2009 | Ozaki et al. | 438/795 |
| 2011/0003482 A1* | 1/2011 | Ogawa et al. | 438/763 |
| 2011/0135557 A1* | 6/2011 | Rangarajan et al. | 423/345 |
| 2012/0076936 A1* | 3/2012 | Hirano | 427/248.1 |
| 2012/0156886 A1* | 6/2012 | Shirako et al. | 438/706 |
| 2012/0234230 A1* | 9/2012 | Halpin et al. | 117/97 |
| 2012/0329286 A1* | 12/2012 | Takeda et al. | 438/781 |
| 2013/0217242 A1* | 8/2013 | Noda et al. | 438/778 |
| 2013/0280921 A1* | 10/2013 | Takeda et al. | 438/781 |
| 2014/0087565 A1* | 3/2014 | Yamaguchi et al. | 438/758 |

FOREIGN PATENT DOCUMENTS

| | | |
|---|---|---|
| JP | A-2005-310861 | 11/2005 |
| JP | A-2006-13503 | 1/2006 |
| JP | A-2006-156664 | 6/2006 |
| JP | A-2006-176811 | 7/2006 |

* cited by examiner

SEMICONDUCTOR DEVICE MANUFACTURING AND PROCESSING METHODS AND APPARATUSES FOR FORMING A FILM

CROSS-REFERENCE TO RELATED APPLICATION

This application claims priority under 35 USC 119 from Japanese Patent Application No. 2011-138471 filed on Jun. 22, 2011 and Japanese Patent Application No. 2012-116772 filed on May 22, 2012, the disclosures of which are incorporated by reference herein.

BACKGROUND

Related Art

The present invention relates to a semiconductor device manufacturing method, a substrate processing method, a substrate processing apparatus and a recording medium, and more particularly, to a semiconductor device manufacturing method and a substrate processing method that include a process of forming an SiC-based film of SiC or the like, and a substrate processing apparatus that is suitably used for these processes and a recording medium.

An SiC-based film of SiC or the like is an insulation film having a high etching resistance and a high oxidation resistance, and may be applied to a transistor gate peripheral or a wiring structure.

In a normal thermal process, a film is formed using a combustible gas and a burnable gas. At normal temperature, since combustible gases form a system in which the gasses do not thermodynamically react with each other, it is difficult to consider using a combination of the combustible gases in the normal thermal process.

However, the present inventors have conducted studies to find a technique that can form an SiC-based film of SiC or the like at a low temperature by a thermal process, using a silicon-based gas and an amine-based gas that correspond to a combination of combustible gases.

SUMMARY

An advantage of some aspects of the present invention is to provide a semiconductor device manufacturing method, a substrate processing method and a substrate processing apparatus that can form an SiC-based film of SiC or the like at a low temperature using a silicon-based gas and an amine-based gas, and a recording medium.

According to an aspect of the present invention, there is provided a semiconductor device manufacturing method including:
  accommodating a substrate in a processing chamber; and
  supplying a silicon-based gas and an amine-based gas into the processing chamber that is heated to form a film including silicon and carbon on the substrate, wherein
   the forming of the film including silicon and carbon includes:
    supplying the silicon-based gas and the amine-based gas into the processing chamber and confining the silicon-based gas and the amine-based gas in the processing chamber;
    maintaining a state in which the silicon-based gas and the amine-based gas are confined in the processing chamber, and
    exhausting an inside of the processing chamber.

According to another aspect of the present invention, there is provided a substrate processing method including:
  accommodating a substrate in a processing chamber; and
  supplying a silicon-based gas and an amine-based gas into the processing chamber that is heated to form a film including silicon and carbon on the substrate, wherein
   the forming of the film including silicon and carbon includes:
    supplying the silicon-based gas and the amine-based gas into the processing chamber and confining the silicon-based gas and the amine-based gas in the processing chamber;
    maintaining a state in which the silicon-based gas and the amine-based gas are confined in the processing chamber, and
    exhausting an inside of the processing chamber.

According to a still another aspect of the present invention, there is provided a substrate processing apparatus including:
  a processing chamber configured to accommodate a substrate;
  a heater configured to heat an inside of the processing chamber;
  a silicon-based gas supply system configured to supply a silicon-based gas into the processing chamber;
  an amine-based gas supply system configured to supply an amine-based gas into the processing chamber;
  an exhaust system configured to exhaust the inside of the processing chamber; and
  a control section configured to control the heater, the silicon-based gas supply system, the amine-based gas supply system and the exhaust system to perform a process of supplying the silicon-based gas and the amine-based gas into the processing chamber that accommodates the substrate and that is heated to form a film including silicon and carbon on the substrate, and at this time, to perform a process of supplying the silicon-based gas and the amine-based gas into the processing chamber and confining the silicon-based gas and the amine-based gas in the processing chamber, a process of maintaining a state in which the silicon-based gas and the amine-based gas are confined in the processing chamber, and a process of exhausting the inside of the processing chamber.

According to a still another aspect of the present invention, there is provided a non-transitory computer-readable medium storing a program that causes a computer to perform a process including:
  accommodating a substrate in a processing chamber of a substrate processing apparatus; and
  supplying a silicon-based gas and an amine-based gas into the processing chamber that is heated to form a film including silicon and carbon on the substrate, wherein
   in the forming of the film including silicon and carbon, supplying the silicon-based gas and the amine-based gas into the processing chamber and confining the silicon-based gas and the amine-based gas in the processing chamber, maintaining a state in which the silicon-based gas and the amine-based gas are confined in the processing chamber, and exhausting an inside of the processing chamber are executed.

BRIEF DESCRIPTION OF THE DRAWINGS

Exemplary embodiments of the present invention will be described in detail based on the following figures, wherein.

DETAILED DESCRIPTION

Hereinafter, preferred embodiments of the present invention will be described.

The present inventors have studied a technique of forming an SiC-based film of SiC or the like at a low temperature using a silicon-based gas and an amine-based gas that form a combination of combustible gases and found that the SiC-based film can be formed without using plasma even in a low temperature region using the silicon-based gas and the amine-based gas that form a combination of combustible gases. That is, the present inventors have found that the silicon-based gas and the amine-based gas that are the combustible gases are respectively thermally decomposed in a gas phase to become active species in a radical state, and thus, substances generated by the decomposition can react with each other to thereby form the SiC-based film. The preferred embodiments of the present invention are based on this knowledge found by the present inventors.

In the present specification, the term of "SiC-based film" means a film including at least silicon (Si) and carbon (C), and the film may include a silicon oxycarbide film (SiOC film), a silicon carbonitride film (SiCN film), a silicon oxycarbonitride film (SiOCN film) and the like, for example, in addition to a silicon carbide film (SiC film).

Hereinafter, the preferred embodiments of the present invention will be described in detail with reference to the accompanying drawings.

Figure 1:
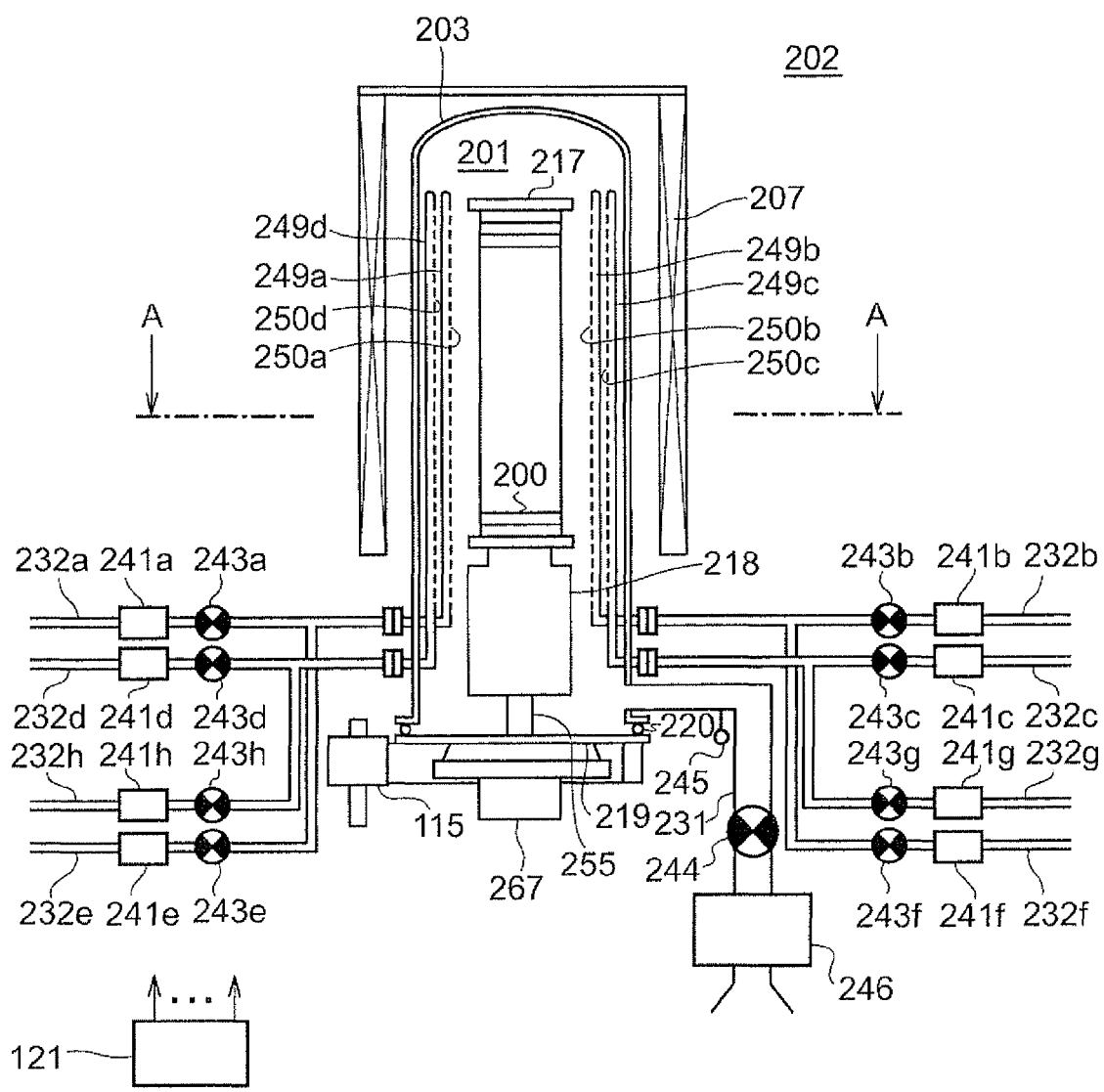
FIG. 1 is a diagram illustrating a schematic configuration of a vertical processing furnace of a substrate processing apparatus which is preferably used in an embodiment of the present invention, in which a processing furnace part is shown in a longitudinal cross-sectional view.
Figure 2:
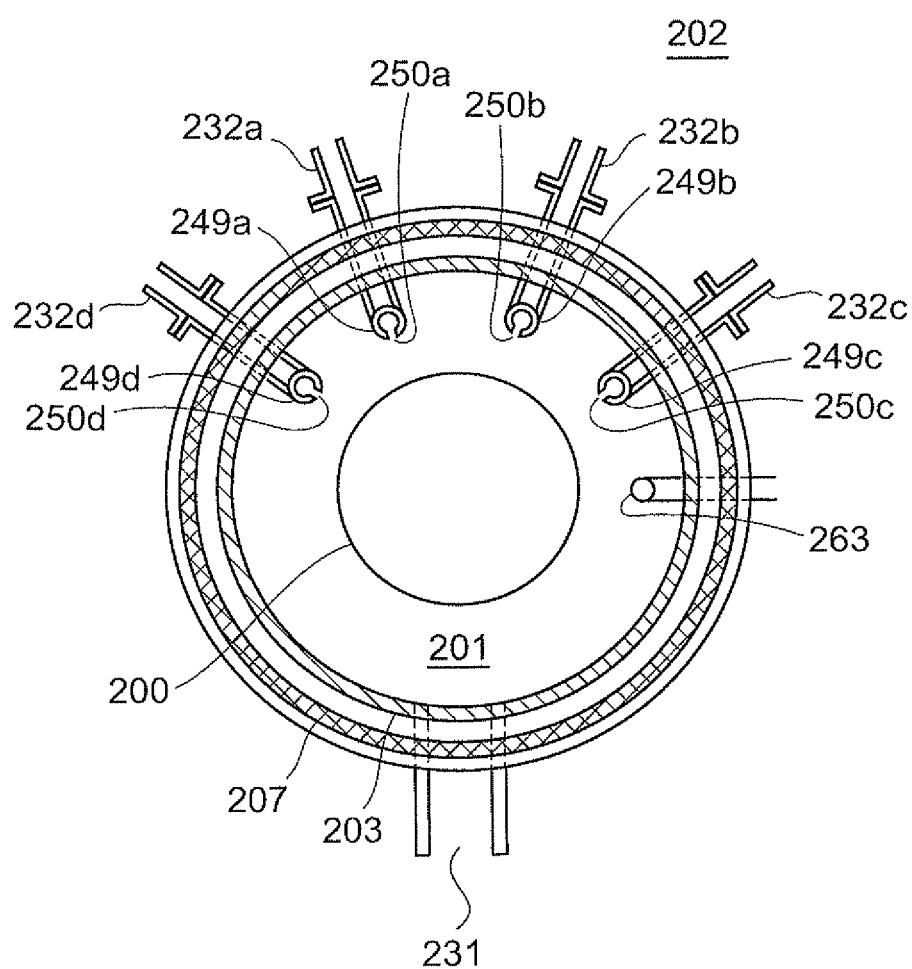
FIG. 2 is a diagram illustrating a schematic configuration of a vertical processing furnace of a substrate processing apparatus which is preferably used in an embodiment of the present invention, in which a processing furnace part is shown in a cross-sectional view taken along line A-A in FIG. 1.

FIG. 1 is a diagram illustrating a schematic configuration of a vertical processing furnace of a substrate processing apparatus which is suitably used in a preferred embodiment of the present invention, in which the part of a processing furnace 202 is shown in a longitudinal cross-sectional view. FIG. 2 is a diagram illustrating a schematic configuration of the vertical processing furnace of the substrate processing apparatus which is suitably used in the preferred embodiment of the present invention, in which the part of the processing furnace 202 is shown in a cross-sectional view taken along line A-A in FIG. 1.

As shown in FIG. 1, the processing furnace 202 has a heater 207 which is heating means (heating mechanism). The heater 207 has a cylindrical shape, and is vertically mounted by being supported by a heater base (not shown) which is a holding plate. The heater 207 also functions as an activation mechanism that decomposes and activates gas by heat, as described later.

A reaction tube 203 that forms a reaction container (processing container) is concentrically installed inside the heater 207. The reaction tube 203 is made of a heat-resistant material such as quartz ($SiO_2$) or silicon carbide (SiC), for example, and has a cylindrical shape in which an upper end thereof is closed and a lower end thereof is opened. A processing chamber 201 is formed in a hollow part of the reaction tube 203, and is configured to accommodate wafers 200 which are substrates in a state where the wafers 200 are vertically aligned at multiple stages in a horizontal posture by a boat 217 (which will be described later).

A first nozzle 249a, a second nozzle 249b, a third nozzle 249c and a fourth nozzle 249d are disposed in the processing chamber 201, which are respectively installed to go through a lower part of the reaction tube 203. A first gas supply tube 232a, a second gas supply tube 232b, a third gas supply tube 232c and a fourth gas supply tube 232d are respectively connected to the first nozzle 249a, the second nozzle 249b, the third nozzle 249c and the fourth nozzle 249d. In this way, four nozzles 249a, 249b, 249c and 249d and four gas supply tubes 232a, 232b, 232c and 232d are installed in the reaction tube 203, and are configured to be able to supply plural types of gases, here, four types of gases into the processing chamber 201. A manifold made of metal that supports the reaction tube 203 may be installed under the reaction tube 203 so that each nozzle is installed to go through a side wall of the metallic manifold. In this case, an exhaust pipe 231 (which will be described later) may be further installed to the metallic manifold. Further, in this case, the exhaust pipe 231 may be installed to a lower part of the reaction tube 203 instead of the metallic manifold. In this way, a furnace port part of the processing furnace may be made of metal, and the nozzles or the like may be attached to the metallic furnace port part.

A mass flow controller (MFC) 241a which is a flow controller (flow control section) and a valve 243a which is an on-off valve are installed in the first gas supply tube 232a sequentially from the upstream direction. Further, a first inert gas supply tube 232e is connected to a downstream side with reference to the valve 243 a of the first gas supply tube 232a. A mass flow controller 241e which is a flow controller (flow control section) and a valve 243e which is an on-off valve are installed in the first inert gas supply tube 232e sequentially from the upstream direction. Further, the above-mentioned first nozzle 249a is connected to a tip end part of the first gas supply tube 232a. The first nozzle 249a is installed to stand up in a loading direction of the wafer 200, along from a lower part to an upper part of an inner wall of the reaction tube 203, in an arc-shaped space between the inner wall of the reaction tube 203 and the wafer 200. The first nozzle 249a is configured as an L-shaped long nozzle. Gas supply ports 250a for gas supply are formed at a side surface of the first nozzle 249a. The gas supply ports 250a are opened to direct toward the center of the reaction tube 203. Plural gas supply ports 250a are installed from the lower part to the upper part of the reaction tube 203, have the same aperture area, and are installed with the same aperture pitch. Mainly, a first gas supply system is configured by the first gas supply tube 232a, the mass flow controller 241a, the valve 243a and the first nozzle 249a. Further, a first inert gas supply system is mainly configured by the first inert gas supply tube 232e, the mass flow controller 241e and the valve 243e.

A mass flow controller (MFC) 241b which is a flow controller (flow control section) and a valve 243b which is an on-off valve are installed in the second gas supply tube 232b sequentially from the upstream direction. Further, a second inert gas supply tube 232f is connected to a downstream side with reference to the valve 243b of the second gas supply tube 232b. A mass flow controller 241f which is a flow controller (flow control section) and a valve 243f which is an on-off valve are installed in the second inert gas supply tube 232f sequentially from the upstream direction. Further, the above-mentioned second nozzle 249b is connected to a tip end part of the second gas supply tube 232b. The second nozzle 249b is installed to stand up in a loading direction of the wafer 200, along from a lower part to an upper part of an inner wall of the reaction tube 203, in an arc-shaped space between the inner wall of the reaction tube 203 and the wafer 200. The second nozzle 249b is configured as an L-shaped long nozzle. Gas supply ports 250b for gas supply are formed at a side surface of the second nozzle 249b. The gas supply ports 250b are opened to direct toward the center of the reaction tube 203. Plural gas supply ports 250b are installed from the lower part to the upper part of the reaction tube 203, have the same aperture area, and are installed with the same aperture pitch. Mainly, a second gas supply system is configured by the second gas supply tube 232b, the mass flow controller 241b, the valve 243b and the second nozzle 249b. Further, a second inert gas supply system is mainly configured by the second inert gas supply tube 232f, the mass flow controller 241f and the valve 243f.

A mass flow controller (MFC) 241c which is a flow controller (flow control section) and a valve 243c which is an on-off valve are installed in the third gas supply tube 232c sequentially from the upstream direction. Further, a third inert gas supply tube 232g is connected to a downstream side with reference to the valve 243c of the third gas supply tube 232c. A mass flow controller 241g which is a flow controller (flow control section) and a valve 243g which is an on-off valve are installed in the third inert gas supply tube 232g sequentially from the upstream direction. Further, the above-mentioned third nozzle 249c is connected to a tip end part of the third gas supply tube 232c. The third nozzle 249c is installed to stand up in a loading direction of the wafer 200, along from a lower part to an upper part of an inner wall of the reaction tube 203, in an arc-shaped space between the inner wall of the reaction tube 203 and the wafer 200. The third nozzle 249c is configured as an L-shaped long nozzle. Gas supply ports 250c for gas supply are formed at a side surface of the third nozzle 249c. The gas supply ports 250c are opened to direct toward the center of the reaction tube 203. Plural gas supply ports 250c are installed from the lower part to the upper part of the reaction tube 203, have the same aperture area, and are installed with the same aperture pitch. Mainly, a third gas supply system is configured by the third gas supply tube 232c, the mass flow controller 241c, the valve 243c and the third nozzle 249c. Further, a third inert gas supply system is mainly configured by the third inert gas supply tube 232g, the mass flow controller 241g and the valve 243g.

A mass flow controller (MFC) 241d which is a flow controller (flow control section) and a valve 243d which is an on-off valve are installed in the fourth gas supply tube 232d sequentially from the upstream direction. Further, a fourth inert gas supply tube 232h is connected to a downstream side with reference to the valve 243d of the fourth gas supply tube 232d. A mass flow controller 241h which is a flow controller (flow control section) and a valve 243h which is an on-off valve are installed in the fourth inert gas supply tube 232h sequentially from the upstream direction. Further, the above-mentioned fourth nozzle 249d is connected to a tip end part of the fourth gas supply tube 232d. The fourth nozzle 249d is installed to stand up in a loading direction of the wafer 200, along from a lower part to an upper part of an inner wall of the reaction tube 203, in an arc-shaped space between the inner wall of the reaction tube 203 and the wafer 200. The fourth nozzle 249d is configured as an L-shaped long nozzle. Gas supply ports 250d for gas supply are formed at a side surface of the fourth nozzle 249d. The gas supply ports 250d are opened to direct toward the center of the reaction tube 203. Plural gas supply ports 250d are installed from the lower part to the upper part of the reaction tube 203, have the same aperture area, and are installed with the same aperture pitch. Mainly, a fourth gas supply system is configured by the fourth gas supply tube 232d, the mass flow controller 241d, the valve 243d and the fourth nozzle 249d. Further, a fourth inert gas supply system is mainly configured by the fourth inert gas supply tube 232h, the mass flow controller 241h and the valve 243h.

In this way, in a gas supply method according to the present embodiment, gases are transported through the nozzles 249a, 249b, 249c and 249d disposed in the arc-shaped vertical space defined by the inner wall of the reaction tube 203 and the edge parts of the plural wafers 200 which are loaded, and are initially ejected into the reaction tube 203 in the vicinity of the wafers 200 from the gas supply ports 250a, 250b, 250c and 250d that are respectively opened in the nozzles 249a, 249b, 249c and 249d. Here, a main flow of the gases in the reaction tube 203 is adjusted in a direction that is parallel to the front surface of the wafer 200, that is, in the horizontal direction. With such a configuration, it is possible to uniformly supply the gases to each wafer 200, and to make uniform the thickness of a thin film formed on each wafer 200. A residual gas after reaction flows toward an exhaust port, that is, the exhaust pipe 231 (which will be described later), but the flow direction of the residual gas is suitably specified according to the position of the exhaust port, and is not limited to the vertical direction.

A silicon-based gas is supplied into the processing chamber 201 through the mass flow controller 241a, the valve 243a and the first nozzle 249a from the first gas supply tube 232a.

An amine-based gas is supplied into the processing chamber 201 through the mass flow controller 241b, the valve 243b and the second nozzle 249b from the second gas supply tube 232b.

An oxygen-containing gas is supplied into the processing chamber 201 through the mass flow controller 241c, the valve 243c and the third nozzle 249e from the third gas supply tube 232c.

A nitrogen-containing gas is supplied into the processing chamber 201 through the mass flow controller 241d, the valve 243d and the fourth nozzle 249d from the fourth gas supply tube 232d.

For example, nitrogen ($N_2$) gas is supplied into the processing chamber 201 through the mass flow controllers 241e, 241f, 241g and 241h, the valves 243e, 243f, 243g and the 243h, the gas supply tubes 232a, 232b, 232c and 232d, and the gas nozzles 249a, 249b, 249c and 249d, respectively, from the inert gas supply tubes 232e, 232f, 232g and 232h.

In a case in which the gases as mentioned above flow through the respective gas supply tubes, a silicon-based gas supply system is configured by the first gas supply system. Further, an amine-based gas supply system is configured by the second gas supply system. Further, an oxygen-containing gas supply system is configured by the third gas supply system. Further, a nitrogen-containing gas supply system is configured by the fourth gas supply system.

The exhaust pipe 231 that exhausts an atmosphere in the processing chamber 201 is installed in the reaction tube 203. As shown in FIG. 2, in a transversal cross-section, the exhaust pipe 231 is installed on the side opposite to the side where the gas supply ports 250a of the first nozzle 249a in the reaction tube 203, the gas supply ports 250b of the second nozzle 249b, the gas supply ports 250c of the third nozzle 249c and the gas supply ports 250d of the fourth nozzle 249d are formed, that is, on the side opposite to the gas supply ports 250a, 250b, 250c and 250d with the wafers 200 being interposed therebetween. Further, as shown in FIG. 1, in a longitudinal section, the exhaust pipe 231 is installed in a lower part with reference to portions where the gas supply ports 250a, 250b, 250c and 250d are installed. With such a configuration, the gases supplied in the vicinity of the wafers 200 in the processing chamber 201 from the gas supply ports 250a, 250b, 250c and 250d flow in the horizontal direction, that is, in the direction parallel to the front surface of the wafer 200, flow downward, and are exhausted through the exhaust pipe 231. The main flow of the gases in the processing chamber 201 becomes a flow flowing in the horizontal direction as described above. A vacuum pump 246 which is a vacuum exhaust device is connected to the exhaust pipe 231 through a pressure sensor 245 which is a pressure detector (pressure detecting section) that detects the pressure in the processing chamber 201 and an APC (Auto Pressure Controller) valve 244 which is a pressure adjustor (pressure adjusting section). As the APC valve 244 opens and closes the value in a state in which the vacuum pump 246 is operated, it is possible to perform vacuum exhaust and vacuum exhaust stop in the processing chamber 201. Further, as the opening level is adjusted in a state in which the vacuum pump 246 is operated, it is possible to adjust the pressure in the processing chamber 201. Mainly, the exhaust system is configured by the exhaust pipe 231, the APC valve 244 and the pressure sensor 245. The vacuum pump 246 may be considered to be included in the exhaust system. As the exhaust system adjusts the opening level of the value of the APC valve 244 on the basis of pressure information detected by the pressure sensor 245 while operating the vacuum pump 246, it is possible to perform vacuum exhaust so that the pressure in the processing chamber 201 becomes a predetermined pressure (vacuum level).

A seal cap 219 that is a furnace port cover capable of air-tightly blocking a lower end aperture of the reaction tube 203 is installed in a lower part of the reaction tube 203. The seal cap 219 is in contact with the lower end of the reaction tube 203 from the lower side in the vertical direction. The seal cap 219 is made of metal such as stainless steel, for example, and is formed in a disk-shape. An O ring 220 which is a seal member that is in contact with the lower end of the reaction tube 203 is installed on an upper surface of the seal cap 219. A rotation mechanism 267 that rotates a boat is installed on the side of the seal cap 219 that is opposite to the processing chamber 201. A rotation shaft 255 of the rotation mechanism 267 goes through the seal cap 219 to be connected to a boat 217 (which will be described later), and rotates the boat 217 to rotate the wafer 200. The seal cap 219 moves up and down in the vertical direction by a boat elevator 115 that is an elevating mechanism which is vertically installed outside the reaction tube 203, and thus, it is possible to transport the boat 217 into or out of the processing chamber 201.

The boat 217 that is a substrate support tool is formed of a heat-resistant material such as quartz or silicon carbide, for example, and supports the plural wafers 200 at multi stages in a state in which the plural wafers 200 are aligned in the horizontal posture and in the state of being centered. A heat insulating member 218 made of a heat-resistance material such as quartz or silicon carbide is disposed under the boat 217, and thus, heat from the heater 207 is hardly transported to the side of the seal cap 219. The heat insulating member 218 may include plural sheets of heat insulating plates made of a heat-resistant material such as quartz or silicon carbide, and a heat insulating plate holder that supports the plural heat insulating plates in the horizontal posture at multi stages.

A temperature sensor 263 that is a temperature detector is installed in the reaction tube 203, and an electrification condition to the heater 207 is adjusted on the basis of the temperature information detected by the temperature sensor 263 so that a temperature in the processing chamber 201 becomes a desired temperature distribution. The temperature sensor 263 is formed in an L-shape in a similar way to the nozzles 249a, 249b, 249c and 249d, and is installed along the inner wall of the reaction tube 203.

Figure 9:
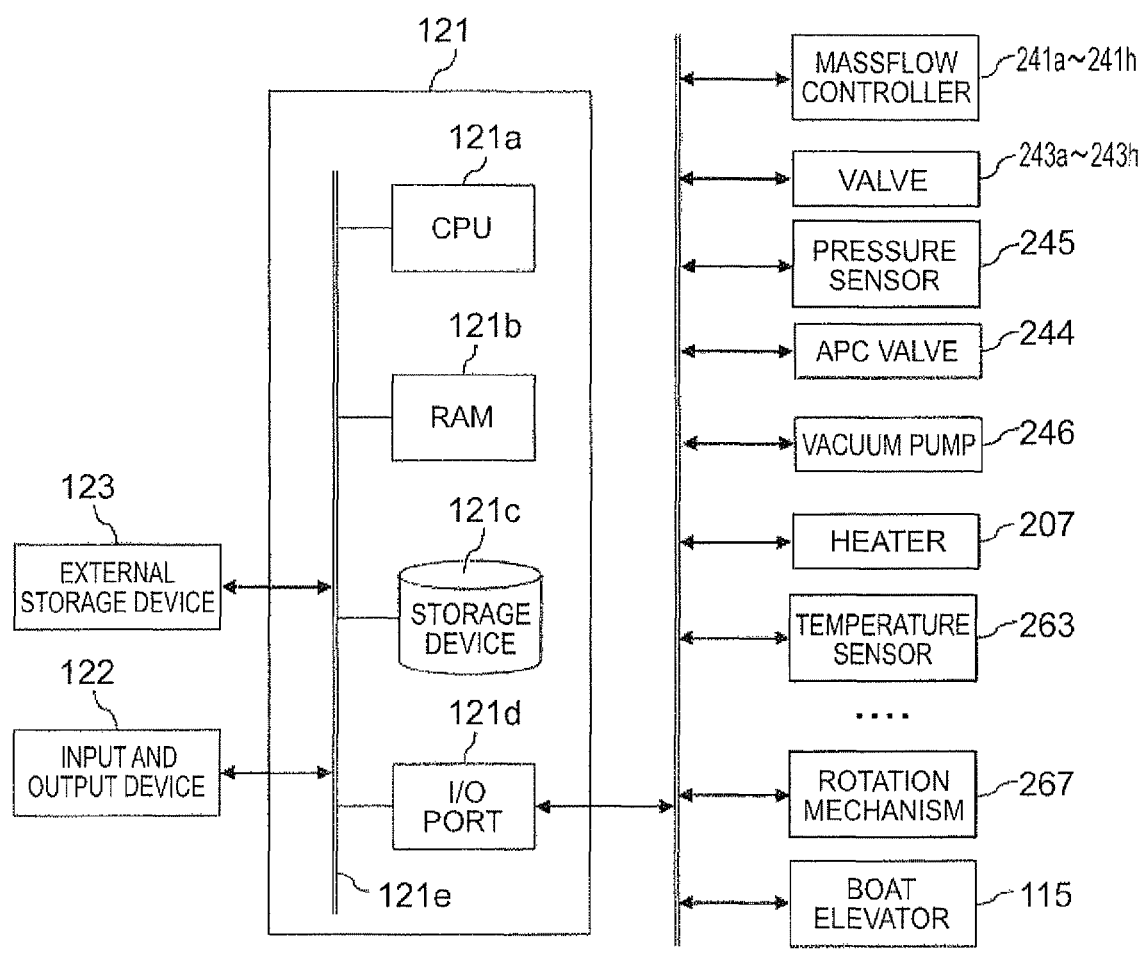
FIG. 9 is a diagram illustrating a schematic configuration of a controller of a substrate processing apparatus which is preferably used in an embodiment of the present invention.

As shown in FIG. 9, a controller 121 that is a control section (control means) is configured as a computer that includes a CPU (Central Processing Unit) 121a, a RAM (Random Access Memory) 121b, a storage device 121c, and an I/O port 121d. The RAM 121b, the storage device 121c and the I/O port 121d are configured to be able to perform data exchange with the CPU 121a through an internal bus 121e. An input and output device 122 that is configured as a touch panel or the like, for example, is connected to the controller 121.

The storage device 121c includes a flash memory, an HDD (Hard Disk Drive) or the like, for example. A control program that controls an operation of the substrate processing apparatus, a process recipe in which an operation, condition or the like of substrate processing (which will be described later) is written, or the like is stored to be readable in the storage device 121c. The process recipe functions as a program that is combined to allow the controller 121 to execute each operation in the substrate processing processes (which will be described later) to obtain a predetermined result. Hereinafter, the process recipe, the control program or the like may be simply referred to as a program. A case in which the term of "program" is used in the present specification may include a case in which only the process recipe is included, a case in which only the control program is included, or a case in which the process recipe and the control program are all included. Further, the RAM 121b is configured as a memory region (work area) in which the program, data or the like read by the CPU 121a is temporarily retained.

The I/O port 121d is connected to the mass flow controllers 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the rotation mechanism 267, the boat elevator 115 and the like, as mentioned above.

The CPU 121a reads the control program from the storage device 121c to be executed and reads the process recipe from the storage device 121c according to input or the like of an operation command from the input and output device 122. Further, the CPU 121a is configured to control the flow rate adjustment operations of various gases through the mass flow controllers 241a, 241b, 241c, 241d, 241e, 241f, 241g and 241h, the on-off operations of the valves 243a, 243b, 243c, 243d, 243e, 243f, 243g and 243h, the pressure adjustment operation through the APC valve 244 based on the on-off operation of the APC valve 244 and the pressure sensor 245, the temperature adjustment operation of the heater 207 based on the temperature sensor 263, and the start-up and stop of the vacuum pump 246, the rotation and rotation speed adjustment operation of the boat 217 through the rotation mechanism 267, the elevating operation of the boat 217 through the boat elevator 115, and the like, according to content of the read program recipe.

The controller 121 is not limited to a configuration as a dedicated purpose computer, and may be configured as a general purpose computer. For example, by preparing an external storage device (for example, a magnetic tape, a magnetic disk such as a flexible disk or a hard disk, an optical disc such as a CD or DVD, a magneto-optical disc such as an MO, a semiconductor memory such as a USB memory or a memory card) 123 that stores the above-mentioned program and by installing the program in the general purpose computer using the external storage device 123, it is possible to configure the controller 121 according to the present embodiment. Means for supplying the program in the computer is not limited to the supply through the external storage device 123. For example, the program may be supplied using communication means such as the Internet or a dedicated line, without going through the external storage device 123. The storage device 121c or the external storage device 123 is configured as a computer-readable storage medium. Hereinafter, the storage device 121c and the external storage device 123 are simply referred to as a recording medium. A case in which the term of "recording medium" is used in the present specification may include a case in which only the storage device 121c is included, a case in which only the external storage device 123 is included, or a case in which the storage device 121c and the external storage device 123 are all included.

Next, a method of supplying a silicon-based gas and an amine-based gas into the processing chamber 201 and forming a film (SiC-based film) including silicon and carbon on the wafer 200 as a substrate using the above-described substrate processing apparatus will be described. In the present embodiment, by using disilane ($Si_2H_6$) gas as the silicon-based gas and using triethylamine (($C_2H_5)_3N$, referred to as TEA) gas as the amine-based gas, a silicon carbide film (SiC film) is formed as the film including the silicon and carbon. Formation of the SiC film is performed under a state without using plasma. In the present embodiment, a semiconductor silicon wafer is used as the wafer 200, and formation of the film (SiC-based film) including the silicon and carbon is performed as a process of a manufacturing process of a semiconductor device. The SiC-based film of SiC or the like is preferably used in a transistor gate peripheral or a wiring structure as an insulation film having high resistances against etching and oxidation.

If the plural wafers 200 are loaded in the boat 217 (wafer charging), as shown in FIG. 1, the boat 217 that supports the plural wafers 200 is raised by the boat elevator 115 to be transported into the processing chamber 201 (boat loading), and the plural wafers 200 are accommodated in the processing chamber 201. In this state, the seal cap 219 is in a state in which the lower end of the reaction tube 203 is sealed through the O ring 220.

Next, in a state in which the vacuum pump 246 is operated, the APC valve 244 is fully opened in a gradual manner to vacuum-exhaust the inside of the processing chamber 201 by the vacuum pump 246, and thus, the base pressure (vacuum level) in the processing chamber 201 is set to 1 Pa or lower. The vacuum pump 246 maintains a state in which the vacuum pump 246 is normally operated at least until the process with respect to the wafer 200 ends. By rotating the boat 217 by the rotation mechanism 267, the wafer 200 rotates (wafer rotation), preferably, the number of revolutions is uniformly maintained in the range of 1 rpm to 10 rpm, for example. Rotation of the boat 217 and the wafer 200 through the rotation mechanism 267 is continuously performed at least until the process with respect to the wafer 200 is completed. By heating the inside of the processing chamber 201 by the heater 207, the temperature in the processing chamber 201 is set to a desired temperature, and thus, the temperature of the wafer 200 is preferably maintained at a desired temperature in the range of 350° C. to 450° C., for example. Here, the power supply level to the heater 207 is feedback-controlled on the basis of the temperature information detected by the temperature sensor 263 so that the inside of the processing chamber 201 reaches a desired temperature distribution (temperature adjustment). Heating the inside of the processing chamber 201 through the heater 207 is continuously performed at least until the process with respect to the wafer 200 is completed.

Thereafter, preferably, nitrogen ($N_2$) gas of several liters per minute is supplied into the processing chamber 201 through the mass flow controllers 241e and 241f, the valves 243e and 243f, the gas supply tube 232a and 232b and the gas nozzles 249a and 249b from the inert gas supply tubes 232e and 232f to perform nitrogen purge for several minutes at an arbitrary pressure, and then, the nitrogen gas supply is stopped to end the nitrogen purge.

Then, in a state in which the APC valve 244 is fully opened, the inside of the processing chamber 201 is vacuum-exhausted by the vacuum pump 246 to preferably set the base pressure in the processing chamber 201 to 1 Pa or lower, for example. As the pressure in the processing chamber 201 is set to 1 Pa or lower, the APC valve 244 is fully closed to start a confined state. Here, the APC value 244 may be slightly opened without being completely closed.

The temperature of the wafer 200 is preferably maintained at the desired temperature in the range of 350° C. to 450° C., for example, and the rotation of the wafer 200 is preferably maintained with the desired number of revolutions in the range of 1 rpm to 10 rpm, for example. In a state in which the APC valve 244 is completely closed, the disilane ($Si_2H_6$) gas as the silicon-based gas is introduced to the processing chamber 201 through the mass flow controllers 241a, the valve 243a and the first nozzle 249a from the first gas supply tube 232a. At the same time, the triethylamine (TEA) gas as the amine-based gas is introduced into the processing chamber 201 through the mass flow controller 241b, the valve 243b and the second nozzle 249b from the second gas supply tube 232b. The disilane gas and the triethylamine gas are confined in the processing chamber 201 on these operations (process A). The triethylamine gas is preferably introduced with a desired flow rate in the range of 0.1 slm to 2 slm, for example, and the disilane gas is preferably introduced with a desired flow rate in the range of 0.05 slm to 0.5 slm, for example. The supply time of the triethylamine gas is preferably set to a desired time in the range of 1 second to 60 seconds, for example, and the supply time of the disilane gas is preferably set to a desired time in the range of 1 second to 10 seconds, for example. Further, the disilane gas and the triethylamine gas are preferably confined in the processing chamber 201 with a desired pressure in the range of 100 Pa to 2000 Pa, for example.

Then, the supply to the processing chamber 201 of the disilane gas and the triethylamine gas is stopped while the APC valve 244 is completely closed. The confined state in the processing chamber 201 of the disilane gas and the triethylamine gas is maintained (process B).

In process A or in process A and process B, the APC valve 244 may be slightly opened without completely closing the APC valve 244, so that the disilane gas and the triethylamine gas are slightly exhausted to slightly form the gas flow. In this case, in process A or in process A and process B, the disilane gas and the triethylamine gas are exhausted from the processing chamber 201 while being supplied into the processing chamber 201, and at this time, a state in which the exhaust rate of the disilane gas and the triethylamine gas from the processing chamber 201 is lower than the supply rate of the disilane gas and the triethylamine gas into the processing chamber 201 may be maintained so that the disilane gas and the triethylamine gas are slightly exhausted. That is, in process A or in process A and process B, by maintaining a state in which the total gas exhaust rate from the processing chamber 201 (total gas exhaust amount per unit time at a predetermined pressure, that is, exhaust flow rate (volume flow rate)) is lower than the total gas supply rate into the processing chamber 201 (total gas supply amount per unit time at a predetermined pressure, that is, supply flow rate (volume flow rate)), the disilane gas and the triethylamine gas may be slightly exhausted. In this case, in process A, the disilane gas and the triethylamine gas are exhausted from the processing chamber 201 while being supplied into the processing chamber 201 to form a state in which the exhaust rate of the disilane gas and the triethylamine gas from the processing chamber 201 is lower than the supply rate of the disilane gas and the triethylamine gas into the processing chamber 201, and in process B, the state is maintained.

Even though the gases supplied into the processing chamber 201 is slightly exhausted in this way, it is possible to form a confined state that is substantially the same as in the case in which the APC valve 244 is completely closed. Accordingly, a state in which the gases supplied into the processing chamber 201 are slightly exhausted in this way in the present specification may be considered to be included in the confined state. That is, in a case in which the term of "confine" is used in the present specification includes a case in which the exhaust of the inside of the processing chamber 201 is stopped by completely closing the APC valve 244, and also includes a case in which the APC valve 244 is slightly opened without being completely closed to maintain the state in which the exhaust rate of the gases supplied into the processing chamber 201 from the processing chamber 201 is lower than the supply rate of the gases supplied into the processing chamber 201 into the processing chamber 201 so that the gases supplied into the processing chamber 201 are slightly exhausted.

Further, after process A and process B are performed predetermined times, the APC valve 244 is fully opened to rapidly exhaust the inside of the processing chamber 201 (process C).

Figure 3:
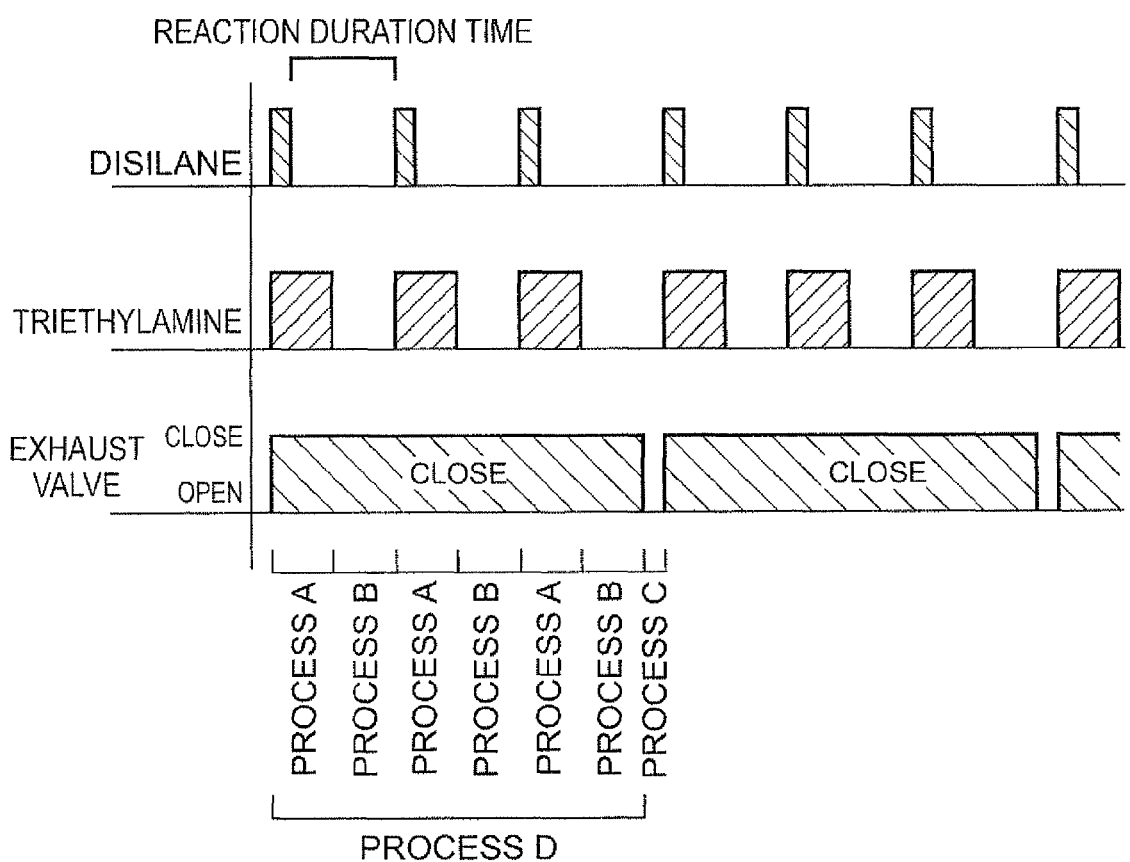
FIG. 3 is a diagram illustrating a film formation sequence according to an embodiment of the present invention.

A cycle that includes a process (process D) in which process A and process B are performed predetermined times and process C are performed predetermined times until the film thickness of the SiC film formed on the wafer 200 becomes a desired film thickness. An example of the cycle and sequence according to the present embodiment is shown in FIG. 3.

Thereafter, preferably, nitrogen ($N_2$) gas of several liters per minute, for example, is supplied into the processing chamber 201 through the mass flow controllers 241e and 241f, the valves 243e and 243f, the gas supply tube 232a and 232b and the gas nozzles 249a and 249b from the inert gas supply tubes 232e and 232f to preferably perform nitrogen purge for several minutes, for example, at an arbitrary pressure, and then, the nitrogen gas supply is stopped to end the nitrogen purge.

Then, the rotation of the boat 217 through the rotation mechanism 267 is stopped to close the APC valve 244, and the nitrogen ($N_2$) gas of several liters per minute is preferably supplied to the processing chamber 201, for example, through the mass flow controllers 241e and 241f, the valves 243e and 243f, the gas supply tube 232a and 232b and the gas nozzles 249a and 249b, from the inert gas supply tubes 232e and 232f until the pressure in the processing chamber 201 reaches atmospheric pressure (return to atmospheric pressure).

The boat 217 that supports the wafers 200 on which the film formation is completed is transported out of the processing chamber 201 by the boat elevator 115 (boat unloading). Then, the plural wafers 200 after the film formation process are extracted from the boat 217.

In the above-described present embodiment, as shown in FIG. 3, a process of alternately repeating the process of supplying the disilane gas and the triethylamine gas into the processing chamber 201 to be confined (process A) and the process of maintaining the state in which the disilane gas and the triethylamine gas are confined in the processing chamber 201 (process B) plural times (for example, three times) (process D), and the process of exhausting the inside of the processing chamber 201 (process C) are alternately repeated plural times. That is, in the present embodiment, the cycle that includes process D of performing the cycle that includes process A and process B over plural cycles (for example, three cycles) and process C is repeated over plural cycles.

In the present embodiment, whenever the cycle that includes process A and process B is performed by three cycles, process C is performed once, but whenever the cycle that includes process A and process B is performed once, process C may be performed. That is, the process of alternately performing process A and process B once and the process C may be alternately repeated plural times. In this case, the cycle that includes process A, process B and process C is repeated plural times.

Further, whenever the cycle that includes process A and process B is performed once, process C may be performed, and the one-time supply amount of the disilane gas and the triethylamine gas in process A may be larger than the one-time supply amount of the disilane gas and the triethylamine gas according to the present embodiment (for example, the supply amount of three times the one-time supply amount of the disilane gas and the triethylamine gas in process A in the present embodiment, which is the same as the supply amount when the cycle that includes process A and process B is performed over three cycles). Here, in this case, since a large amount of gas is supplied by one-time supply, the film formation speed is increased, but the pressure in the processing chamber 201 is rapidly increased, and thus, wafer in-plane film thickness uniformity or step coverage may be deteriorated.

On the other hand, whenever the cycle that includes process A and process B is performed once, process C is performed, and if the one-time supply amount of the disilane gas and the triethylamine gas in process A is decreased (for example, the supply amount which is the same as or less than the one-time supply amount of the disilane gas and the triethylamine gas in process A in the present embodiment), the wafer in-plane film thickness uniformity or step coverage is improved, but the film formation speed becomes slow.

In the present embodiment, whenever the cycle that includes process A and process B is performed by three cycles, process C is performed once. That is, in a state in which the APC valve 244 is completely closed, the disilane gas and the triethylamine gas are respectively supplied plural times (three times), and the pressure in the processing chamber 201 is gradually increased at multi stages (here, 3 stages). At the first stage (first cycle), the pressure is the lowest among three stages and the film formation rate is the lowest, but the wafer in-plane film thickness uniformity or step coverage may be the most satisfactory. On the other hand, at the third stage (third cycle), the pressure is the highest among three stages and the film formation rate is the highest, but the wafer in-plane film thickness uniformity or step coverage may be deteriorated. The second stage (second cycle) has an intermediate characteristic between the first stage (first cycle) and the third stage (third cycle).

Here, as in the present embodiment, in a case in which the pressure is increased at multi stages such as three stages, since a film having satisfactory wafer in-plane film thickness uniformity or step coverage is formed at the first stage (first cycle), a film is formed using the film having satisfactory wafer in-plane film thickness uniformity or step coverage as a base at the second stage, the third stage or the like. Here, due to the influence of the base, a film having satisfactory wafer in-plane film thickness uniformity or step coverage is formed thereafter. In this way, in a case in which the pressure is increased at multi stages, it is possible to form an initial layer having satisfactory wafer in-plane film thickness uniformity or step coverage in an initial stage, and then, it is possible to increase the film formation rate while maintaining wafer in-plane film thickness uniformity or step coverage.

In the present embodiment, the supply time of the triethylamine gas is longer than the supply time of the disilane gas, but the supply time of the triethylamine gas and the supply time of the disilane gas may be the same, or the supply time of the triethylamine gas may be shorter than the supply time of the disilane gas. Here, it is preferable that the supply time of the triethylamine gas be the same as the supply time of the disilane gas.

However, in the present embodiment, in process A of supplying the disilane gas and the triethylamine gas into the processing chamber 201 to be confined, due to the supply of the disilane gas and the triethylamine gas into the heated processing chamber 201, the disilane gas and the triethylamine gas are thermally decomposed in the processing chamber 201. That is, a gas phase decomposition reaction may thermally occur. Even in process B in addition to process A, the disilane gas and the triethylamine gas supplied into the processing chamber 201 are thermally decomposed.

By thermally decomposing the disilane ($Si_2H_6$) gas, for example, a substance such as $SiH_3+SiH_3$, $Si_2H_4+H_2$ or $SiH_4+SiH_2$ is generated. Further, by thermally decomposing the triethylamine (($C_2H_5$)$_3$N) gas, for example, a substance such as $(C_2H_5)_2N)+C_2H_5$, $C_2H_5N+2C_2H_5$, $N+3C_2H_5$ is generated. These substances are representative substance examples that mainly contribute to the reaction when the SiC film is formed on the wafer 200.

Further, in order to thermally decompose the disilane gas and the triethylamine gas, in process A of supplying the disilane gas and the triethylamine gas into the processing chamber 201 to be confined, the pressure in the processing chamber 201 is set to a pressure in the range of 100 Pa to 2000 Pa, preferably, due to the supply of the disilane gas and the triethylamine gas into the processing chamber 201. Further, the temperature of the heater 207 is preferably set to a temperature at which the temperature of the wafer 200 becomes a temperature in the range of 350° C. to 450° C. The $N_2$ gas that is an inert gas may be supplied from the inert gas supply tubes 232e and 232f into the processing chamber 201. Further, a rare gas such as Ar gas, He gas, Ne gas or Xe gas, instead of the $N_2$ gas, may be used as the inert gas.

If the temperature of the wafer 200 is lower than 350° C., the disilane gas is not thermally decomposed, and the reaction with the substance obtained by thermally decomposing the triethylamine gas does not occur, and thus, the SiC film is not formed. If the temperature of the wafer 200 exceeds 450° C., the amount of nitrogen (N) remaining in the SiC film exceeds an impurity level, the nitrogen acts as a component of forming a film, and thus, the SiC film is not formed (an SiCN film instead of the SiC film is formed). Further, if the temperature of the wafer 200 exceeds 450° C., the gas phase reaction excessively occurs, and thus, it is difficult to secure wafer in-plane film thickness uniformity. Accordingly, it is preferable that the temperature of the wafer 200 be in the range of 350° C. to 450° C.

Further, if the pressure in the processing chamber 201 is lower than 100 Pa, the reaction between the substance obtained by thermally decomposing the disilane gas and the substance obtained by thermally decomposing the triethylamine gas hardly occurs. If the pressure in the processing chamber 201 exceeds 2000 Pa, it takes tune to exhaust the inside of the processing chamber 201 in process C, to affect a throughput. Further, if the pressure in the processing chamber 201 exceeds 2000 Pa, the amount of nitrogen (N) gas remaining in the SiC film exceeds the impurity level, the nitrogen acts as a component of forming the film, and thus, the SiC film is not formed (an SiCN film instead of the SiC film is formed). Further, the gas phase reaction excessively occurs, and thus, it is difficult to secure wafer in-plane film thickness uniformity. Accordingly, it is preferable that the pressure in the processing chamber 201 be in the range of 100 Pa to 2000 Pa.

In the processing chamber 201 under such a state (condition), if the supply flow rate of the disilane gas is lower than 50 sccm, the film formation rate is extremely deteriorated. Further, if the supply flow rate of the disilane gas exceeds 500 sccm, the amount of carbon (C) in the SiC film is decreased. Accordingly, it is preferable that the supply flow rate of the disilane gas be in the range of 50 to 500 sccm (0.05 to 0.5 slm).

Further, it is difficult to set the supply time of the disilane gas to be shorter than 1 second in view of valve control. It is preferable that the supply time of the disilane gas be set to be as short as possible and the reaction duration time (time when the supply of disilane gas is stopped) be set to be as long as possible. That is, it is preferable to supply an appropriate amount of disilane gas in a short time. Accordingly, it is preferable to set the supply time of the disilane gas to a time in the range of 1 to 10 seconds.

Further, in the processing chamber 201 under such a state (condition), if the supply flow rate of the triethylamine gas is lower than 100 sccm, the amount of carbon (C) in the SiC film is extremely decreased. If the supply flow rate of the triethylamine gas exceeds 2000 sccm, the amount of the triethylamine gas that does not contribute to the reaction is increased, which is useless. Accordingly, it is preferable that the supply flow rate of the triethylamine gas be a flow rate in the range of 100 to 2000 sccm (0.1 to 2 slm).

Further, it is difficult to set the supply time of the triethylamine gas to be shorter than 1 second in view of valve control. It is preferable that the supply time of the triethylamine gas be set to be as short as possible and the reaction duration time be set to be as long as possible. That is, it is preferable to supply an appropriate amount of triethylamine gas in a short time, Accordingly, it is preferable to set the supply time of the triethylamine gas to a time in the range of 1 to 60 seconds.

In process B of stopping the supply of the disilane gas and the triethylamine gas into the processing chamber 201 and maintaining the state in which the disilane gas and the triethylamine gas are confined in the processing chamber 201, the substances generated by thermally decomposing the disilane gas and the triethylamine gas in the processing chamber 201 by the supply of the disilane gas and the triethylamine gas into the heated processing chamber 201 react with each other. That is, the substance such as $SiH_3+SiH_3$, $Si_2H_4+H_2$ or $SiH_4+SiH_2$ generated by thermally decomposing the disilane gas and the substance such as $(C_2H_5)_2N+C_2H_5$, $C_2H_5N+2C_2H_5$, $N+3C_2H_5$ generated by thermally decomposing the triethylamine gas react with each other. This reaction mostly corresponds to the gas phase reaction, but a surface reaction also slightly occurs. This reaction occurs in process A, and is continued in process B. The SiC film is formed on the wafer 200 by this reaction. Since the decomposed disilane gas and the decomposed triethylamine gas mainly react with each other and the reaction speed is considerably slow (it takes time for reaction), the state in which the disilane gas and the triethylamine gas are confined in the processing chamber 201 is maintained to secure time for reaction. Thus, it is possible to form the SiC film.

Here, the pressure in the processing chamber 201 maintains a pressure in the range of 100 to 2000 Pa, preferably. Further, preferably, the temperature of the heater 207 is set to a temperature at which the temperature of the wafer 200 becomes a temperature in the range of 350° C. to 450° C. That is, the pressure in the pressure range and the temperature in the temperature range that are the same as in process A are maintained.

The time when the supply of the disilane is stopped is preferably set to a time in the range of 5 to 500 seconds, for example. If the time when the supply of disilane gas is stopped is set to be shorter than 5 seconds, the reaction of the substances generated by thermally decomposing the disilane gas and the triethylamine gas is not insufficient. If this reaction is performed to some extent, the amount of the substances generated by thermally decomposing the disilane gas and the triethylamine gas is decreased, and thus, the reaction occurs, but reaction efficiency is deteriorated. Even though this state is continued, the film formation in a state in which the film formation rate is decreased is continued. That is, if the time when the supply of disilane gas is stopped is excessively enlarged, it affects the throughput. Accordingly, it is preferable that the time when the supply of disilane gas is stopped be set to a time in the range of 5 to 500 seconds.

It is confirmed that the cycle rate (film formation rate per cycle (cycle that includes process A and process B)) of the SiC film formed according to the present embodiment is 0.01 to 0.5 nm/cycle, and it is possible to obtain an arbitrary film thickness by controlling the number of cycles. For example, as the film thickness of the SiC film in a case in which the SiC film is applied to an etching stopper, 100 to 500 Å (10 to 50 mm) is used, and in this case, by repeating the cycle over 20 to 5000 cycles, for example, it is possible to realize the film thickness.

In the present embodiment, since the disilane gas and the triethylamine gas are supplied into the processing chamber 201 to be confined, even in a case where the disilane gas and the triethylamine gas that hardly react with each other in a low temperature region are used, it is possible to enhance the gas phase reaction efficiency, and to enhance the film formation efficiency (consumption and film formation rate or the like of the disilane gas and the triethylamine gas).

Further, in this method, according to the time when the state in which the disilane gas and the triethylamine gas are confined in the processing chamber 201 is maintained, the concentration of carbon (C) atoms in the SiC film can be controlled to be 1 to 40%, for example. That is, according to the time when the supply of the disilane gas and the triethylamine gas is stopped, particularly, according to the time when the supply of disilane gas is stopped, it is possible to control the concentration of carbon (C) atoms in the SiC film. In the film formation through the thermal process in the low temperature region as in the present embodiment, it is confirmed that the carbon concentration in the SiC film is limited to 40% and the concentration exceeding 40% cannot be realized. By controlling the carbon concentration in the SiC film and increasing the carbon concentration in the SiC film, it is possible to reduce a relative dielectric constant (k value) of the SiC film, and to enhance etching resistance.

In the present embodiment, an example in which the silicon carbide film (SiC film) is formed as the SiC-based film has been described, but by increasing the temperature of the wafer 200 and the pressure in the processing chamber 201, it is possible to introduce the nitrogen (N) included in the amine-base gas into the film, and also to form the silicon carbonitride film (SiCN film) as the SiC-based film.

Further, in the present embodiment, an example in which the silicon carbide film (SiC film) is formed as the SiC-based film has been described, but by providing a process of supplying a nitrogen-containing gas and/or a process of supplying an oxygen-containing gas in the period when the supply of the disilane gas and the triethylamine gas is stopped, as in process B, for example, it is possible to form at least one type of film among a silicon carbonitride film (SiCN film), a silicon oxycarbide film (SiOC film) and a silicon oxycarbonitride film (SiOCN film) as the SiC-based film.

Figure 4:
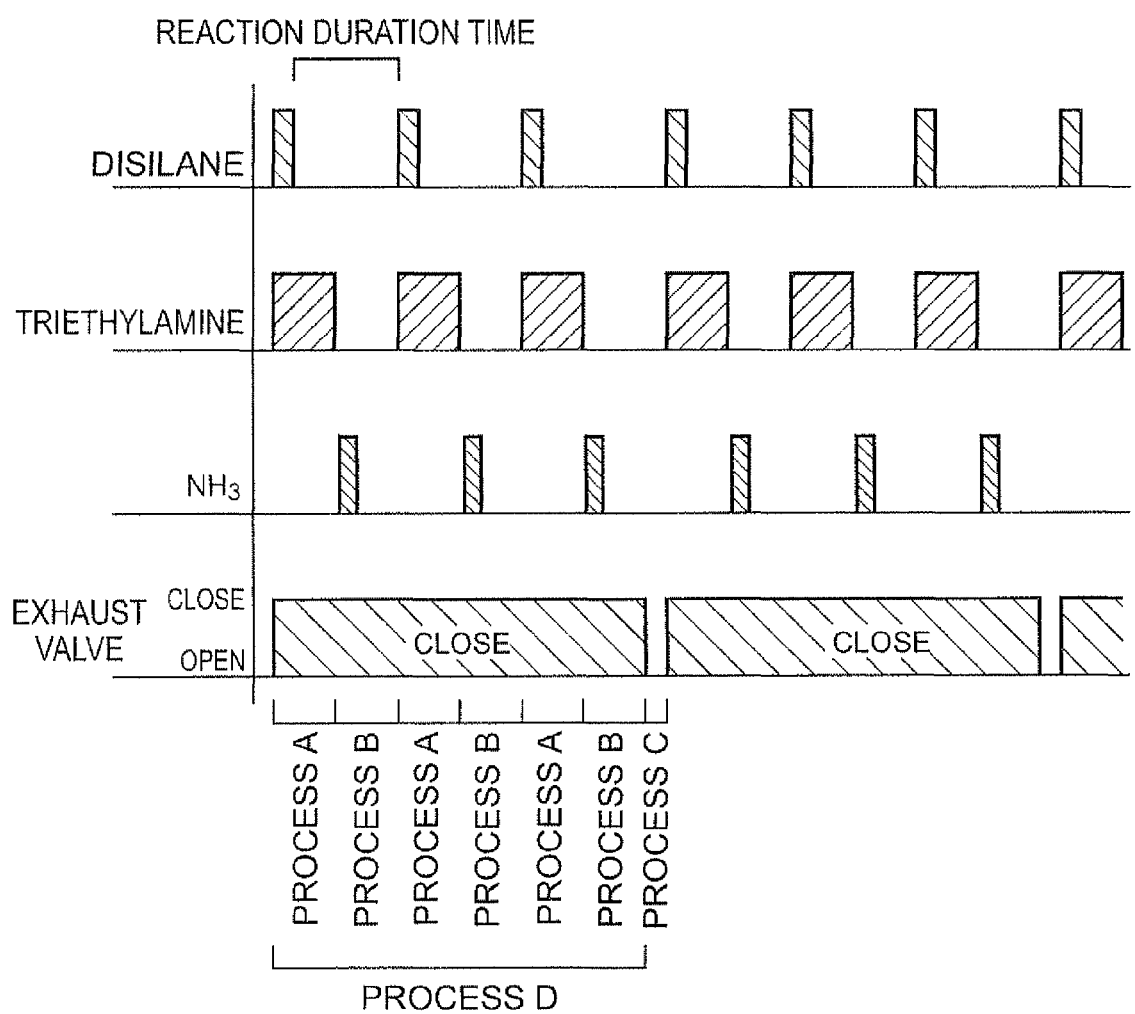
FIG. 4 is a diagram illustrating another example of the film formation sequence according to an embodiment of the present invention.

For example, as shown in FIG. 4, by providing a process of supplying $NH_3$ gas, for example, as the nitrogen-containing gas in process B, it is possible to form the silicon carbonitride film (SiCN film) as the SiC-based film.

The nitrogen-containing gas is supplied into the processing chamber 201 from the fourth gas supply tube 232d through the mass flow controller 241d, the valve 243d and the fourth nozzle 249d.

Figure 5:
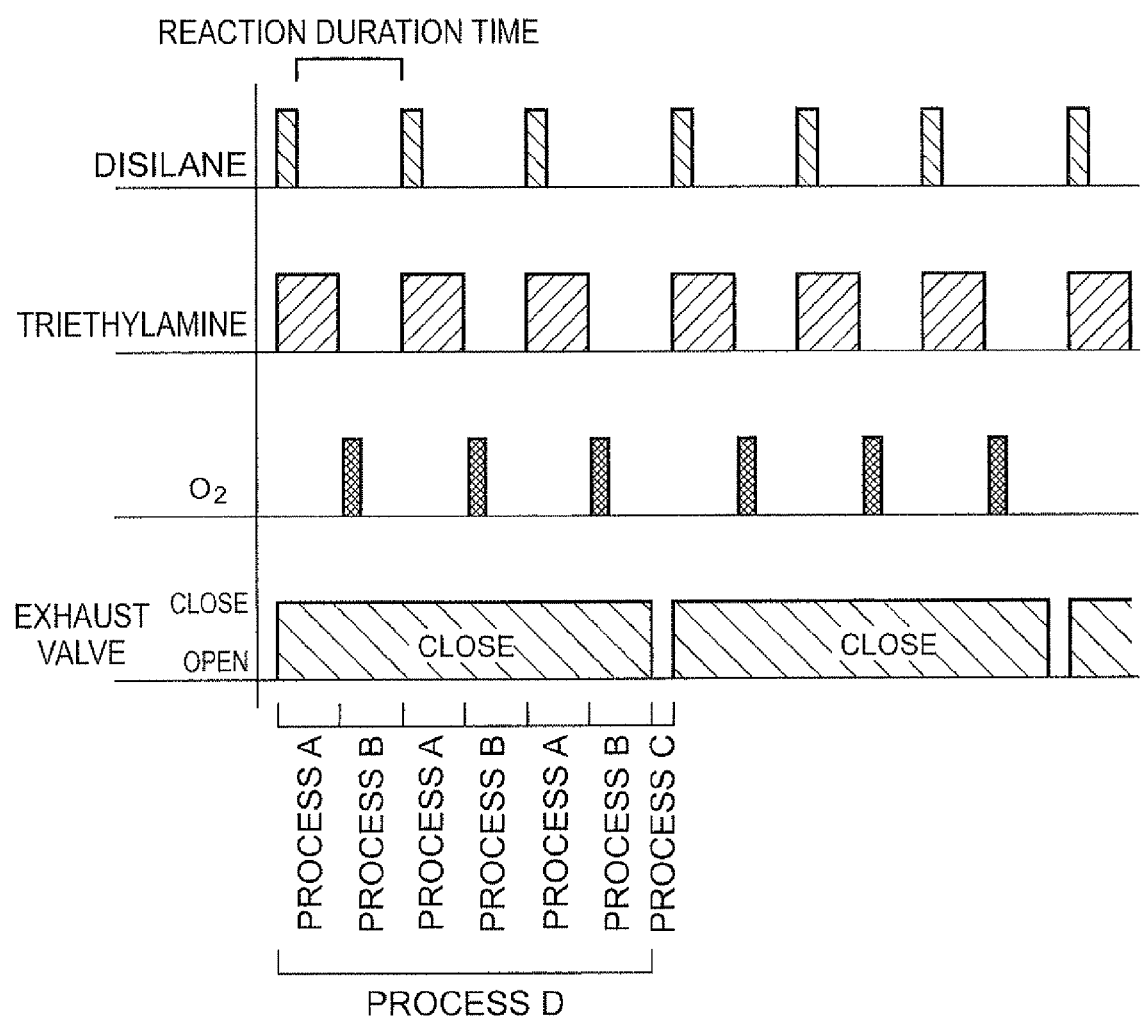
FIG. 5 is a diagram illustrating still another example of the film formation sequence according to an embodiment of the present invention.

Further, for example, as shown in FIG. 5, by providing a process of supplying $O_2$ gas, for example, as the oxygen-containing gas in process B, it is possible to form the SiOC film as the SiC-based film.

The oxygen-containing gas is supplied into the processing chamber 201 from the third gas supply tube 232c through the mass flow controller 241c, the valve 243c and the third nozzle 249c.

Figure 6:
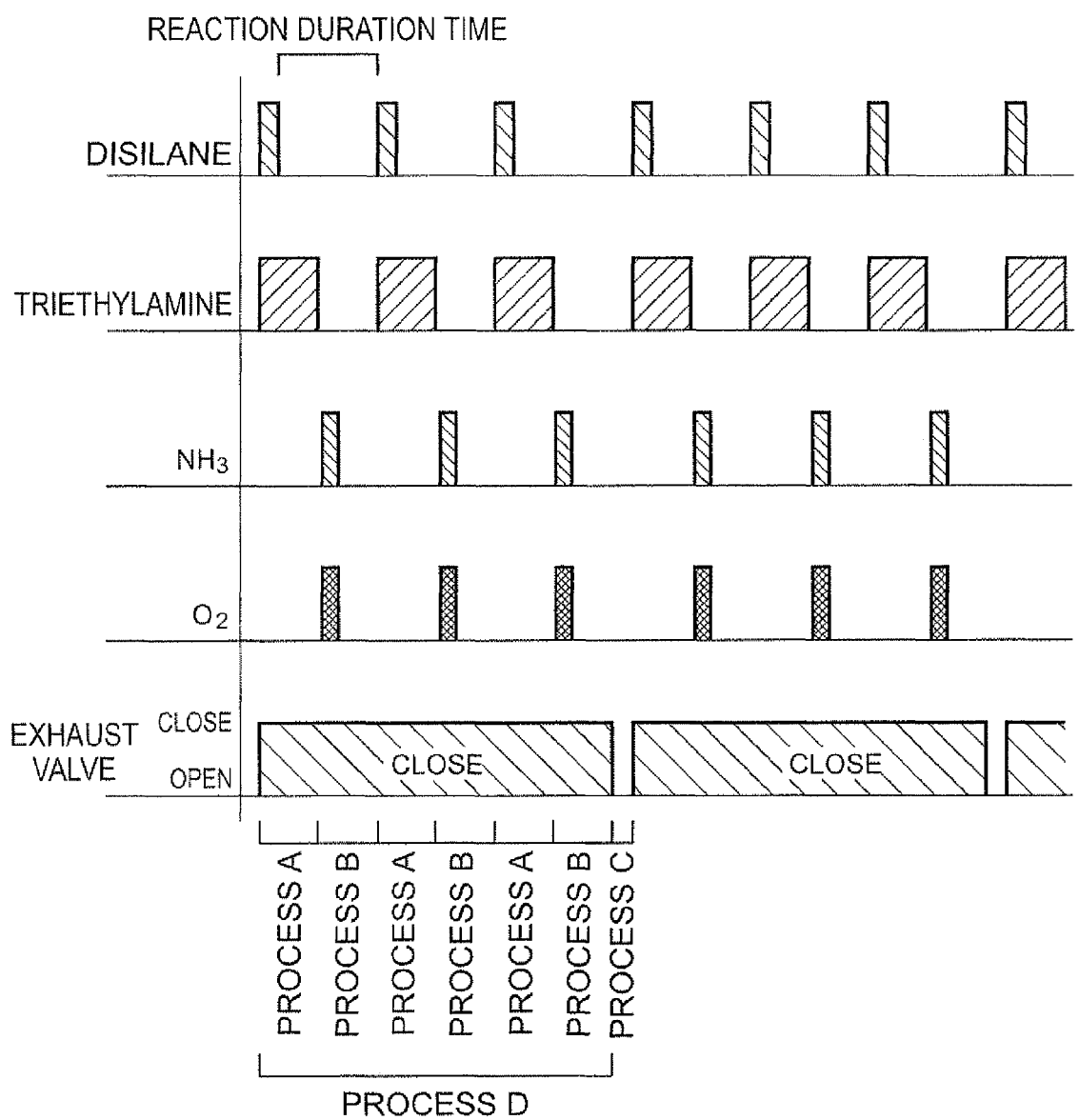
FIG. 6 is a diagram illustrating still another example of the film formation sequence according to an embodiment of the present invention.

Further, for example, as shown in FIG. 6, by providing a process of supplying the $NH_3$ gas, for example, as the nitrogen-containing gas and a process of supplying the $O_2$ gas, for example, as the oxygen-containing gas in process B, it is possible to form the SiOCN film as the SiC-based film.

In FIG. 6, the process of supplying the $NH_3$ gas and the process of supplying the $O_2$ gas are simultaneously performed, but the process of supplying the $NH_3$ gas may be performed before the process of supplying the $O_2$ gas, or the process of supplying the $O_2$ gas may be performed before the process of supplying the $NH_3$ gas.

In FIGS. 4, 5 and 6, an example in which the process of supplying the nitrogen-containing gas and/or the process of supplying the oxygen-containing gas are provided in the period when the supply of the disilane gas and the triethylamine gas is stopped as in process B has been described, but the process of supplying the nitrogen-containing gas and/or the process of supplying the oxygen-containing gas may be provided in the period when the supply of the disilane gas and the triethylamine gas is continuously performed as in process A to thereby form at least one type of film among the SiCN film, the SiOC film and the SiOCN film as the SiC-based film.

The silicon-based gas refers to a gas (silicon-containing gas) that contains silicon. As the silicon-based gas, for example, a silane-based gas such as disilane ($Si_2H_6$) gas or trisilane ($Si_3H_8$) gas may be preferably used. In the present embodiment, as the silicon-based gas, a silane-based gas that contains silicon (Si) and hydrogen (H) and does not contain chlorine (Cl) is used.

The amine-based gas is a gas that includes an amine group, and is a gas that includes at least carbon (C), nitrogen (N) and hydrogen (H). The amine-based gas includes amine such as ethylamine, propylamine, isopropylamine, butylamine or isobutylamine. Here, the amine generally refers to a compound of a type obtained by replacing hydrogen atoms of ammonia ($NH_3$) with a hydrocarbon group such as an alkyl group. That is, the amine includes the hydrocarbon group such as an alkyl group. The amine-based gas may be referred to as a silicon non-containing gas since silicon is not included therein, and may also be referred to as a silicon and metal non-containing gas since silicon and metal are not included therein. As the amine-based gas, for example, an ethylamine-based gas such as diethylamine (($C_2H_5)_2NH$, simply referred to as DEA) or monoethylamine ($C_2H_5NH_2$, simply referred to as MEA), a propylamine-based gas such as tripropylamine (($C_3H_7)_3N$, simply referred to as TPA), dipropylamine (($C_3H_7)_2NH$, simply referred to as DPA), or monopropylamine ($C_3H_7NH_2$, simply referred to as MPA), an isopropylamine-based gas such as triisopropylamine ($[(CH_3)_2CH]_3N$, simply referred to as TIPA), diisopropylamine ($[CH_3)_2CH]_2NH$, simply referred to as DIPA) or monoisopropylamine (($CH_3)_2CHNH_2$, simply referred to as MIPA), a butylamine-based gas such as tributylamine (($C_4H_9)_3N$, simply referred to as TBA), dibutylamine (($C_4H_9)_2NH$, simply referred to as DBA), or monobutylamine ($C_4H_9NH_2$, simply referred to as MBA), or an isobutylamine-based gas such as triisobutylamine ($[(CH_3)_2CHCH_2]_3N$, simply referred to as TIBA), diisobutylamine ($[(CH_3)_2CHCH_2]_2NH$, simply referred to as DIBA), or monoisobutylamine (($CH_3)_2CHCH_2NH_2$, simply referred to as MIBA), in addition to triethylamine (($C_2H_5)_3N$, simply referred to as TEA), may be preferably used. That is, as the amine-based gas, for example, at least one type of gas of $(C_2H_5)_xNH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (here, x is an integer of 1 to 3) may be preferably used.

As the nitrogen-containing gas, for example, ammonia ($NH_3$) gas, diazene ($N_2H_2$) gas, hydrazine ($N_2H_4$) gas, $N_3H_8$ gas or the like may be preferably used. Since the nitrogen ($N_2$) gas is an inert gas and is not introduced into the SiC film, the nitrogen ($N_2$) gas is excluded from the nitrogen-containing gas.

As the oxygen-containing gas, for example, oxygen ($O_2$) gas, nitrous oxide ($N_2O$) gas, nitric monoxide (NO) gas, nitrogen dioxide ($NO_2$) gas, ozone ($O_3$) gas, hydrogen ($H_2$) gas+$O_2$ gas, $H_2$ gas+$O_3$ gas, vapor ($H_2O$) gas, carbon monoxide (CO) gas, carbon dioxide ($CO_2$) gas or the like may be preferably used.

EXAMPLES

Example 1

The SiC film was formed on the wafer 200 as an evaluation sample, by the film formation sequence according to the present embodiment, described with reference to FIG. 3. Here, the temperature of the processing chamber 201 and the wafer 200 were set to 425° C., the supply amount of materials, that is, the supply flow rate of the materials and the supply time were respectively set as described as follows with respect to a volume 100L of the processing chamber 201. That is, the supply flow rate and the supply time of the triethylamine gas were respectively set to 0.35 slm and 20 seconds, and the supply flow rate and the supply time of the disilane gas were respectively set to 0.10 slm and 3 seconds. The reaction duration time per cycle (cycle including process A and process B, the same hereinafter), that is, the time when the supply of disilane gas was stopped per cycle was changed around between 50 seconds and 250 seconds to create plural, here, three evaluation samples. Other processing conditions in each process were set to conditions within the processing condition range written in the above-described embodiment. Further, the densities of the carbon (C) and the nitrogen (N) in the SiC film in the plural evaluation samples were measured by X-ray Fluorescence Analysis (XRF).

Figure 7:
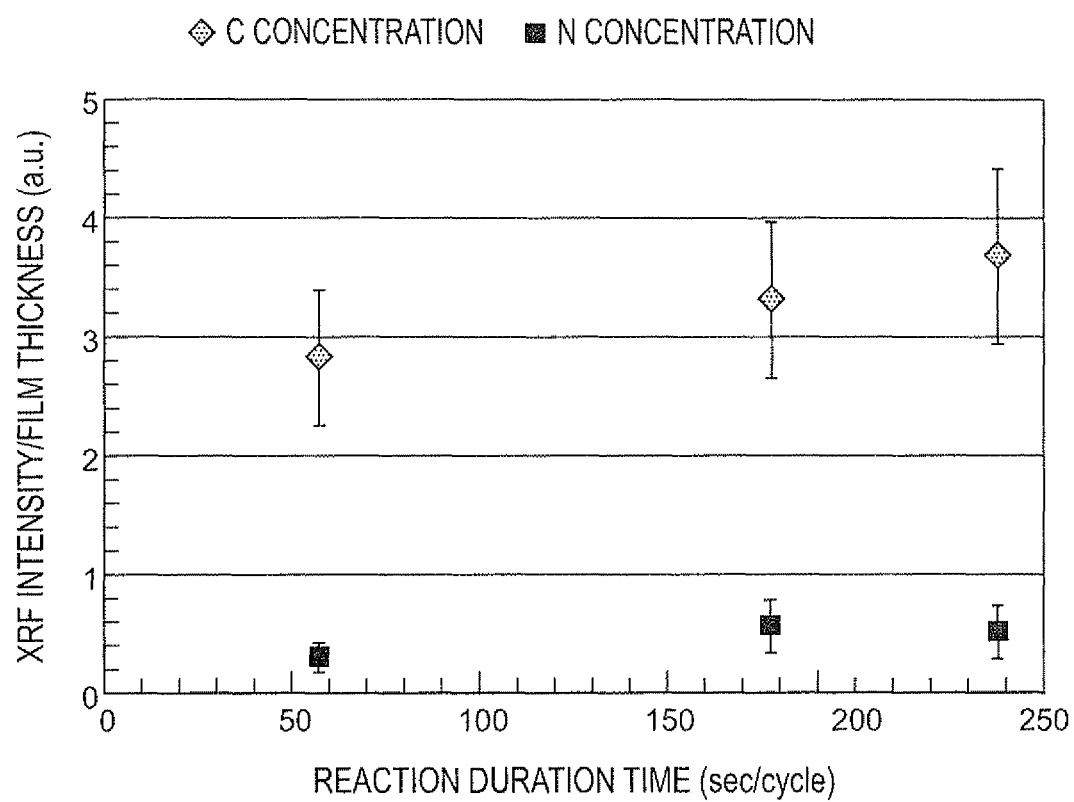
FIG. 7 is a diagram illustrating the relationship between a reaction duration time (time when the supply of disilane gas is stopped), per cycle, of an SiC film formed in Example 1 of the present invention and densities of carbon (C) and nitrogen (N) in the SiC film.

The result is shown in FIG. 7. The horizontal axis in FIG. 7 represents the reaction duration time per cycle (second/cycle), that is, the time when the supply of disilane gas is stopped per 1 cycle (second/cycle), and the vertical axis represents the XRF intensity/film thickness (arbitrary unit (a. u.)). The XRF intensity/film thickness represents a value obtained by dividing the X-ray intensity of the X-ray Fluorescence Analysis (XRF) by the film thickness.

It can be understood from FIG. 7 that the reaction duration time is changed to be able to control the carbon concentration in the SiC film. That is, it can be understood that as the reaction duration time is lengthened, the carbon concentration in the SiC film is increased, and as the reaction duration time is shortened, the carbon concentration in the SiC film is decreased. It is confirmed that the concentration of carbon atoms in three points in FIG. 7 is approximately 20%, 26% and 30%, sequentially from the left. Further, it is confirmed that the concentration of nitrogen atoms in three points in FIG. 7 is approximately 2%, 4% and 5%, sequentially from the left, which is at the impurity level. In this way, according to the present example, it was found that the reaction duration time was changed to be able to control the carbon concentration in the SiC film, that is, the composition ratio of the SiC film.

Example 2

The SiC film was formed on the wafer 200 as an evaluation sample, by the film formation sequence according to the present embodiment, described with reference to FIG. 3. Here, processing conditions in each process were set to the same conditions as the conditions in the above-described Example 1. Here, in example 2, the reaction duration time per cycle, that is, the time when the supply of disilane gas was stopped per cycle was changed between 18 seconds and 98 seconds to create plural, here, four evaluation samples. Further, the densities of the carbon (C) and the nitrogen (N) in the SiC film in the plural evaluation samples were measured by X-ray Fluorescence Analysis (XRF).

Figure 8:
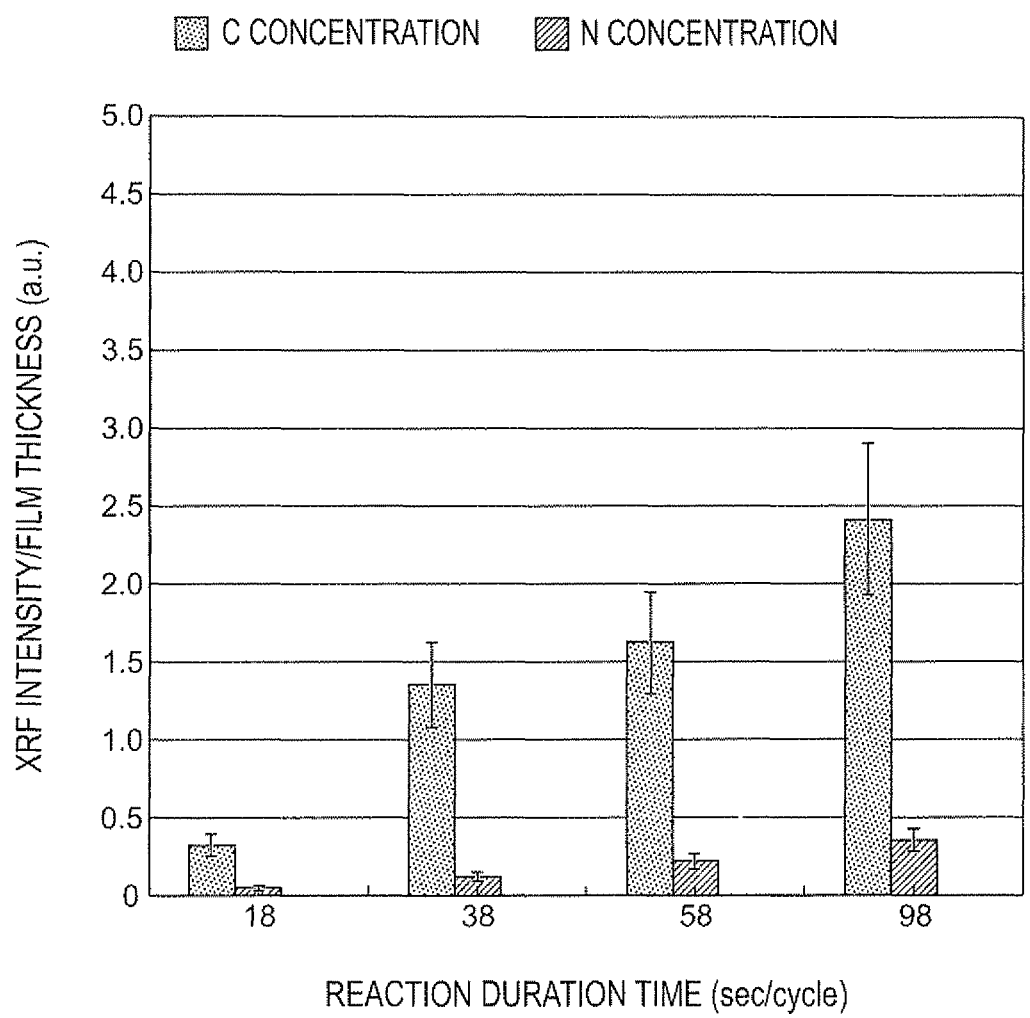
FIG. 8 is a diagram illustrating the relationship between a reaction duration time (time when the supply of disilane gas is stopped), per cycle, of an SiC film formed in Example 2 of the present invention and densities of carbon (C) and nitrogen (N) in the SiC film.

The result is shown in FIG. 8. The horizontal axis in FIG. 8 represents the reaction duration time per cycle (second/cycle), that is, the time of the supply of disilane gas is stopped per cycle (second/cycle), and the vertical axis represents the XRF intensity/film thickness (arbitrary unit (a. u.)). The XRF intensity/film thickness. represents a value obtained by dividing the X-ray intensity of the X-ray Fluorescence Analysis (XRF) by the film thickness.

It can be understood from FIG. 8, in a similar way to example 1, that the reaction duration time is changed to be able to control the carbon concentration in the SiC film. That is, it can be understood that as the reaction duration time is lengthened, the carbon concentration in the SiC film is increased, and as the reaction duration time is shortened, the carbon concentration in the SiC film is decreased. It is confirmed that the concentration of carbon atoms in the SiC film in four evaluation samples in FIG. 8 is approximately 2.5%, 11%, 13% and 20%, sequentially from the left. Further, it is confirmed that the concentration of nitrogen atoms in the SiC film in four evaluation samples in FIG. 8 is all lower than 5%, which is at the impurity level. In this way, according to the present example, it was found that the reaction duration time was changed to be able to control the carbon concentration in the SiC film, that is, the composition ratio of the SiC film.

Example 3

The SiC film was formed on the wafer 200 as an evaluation sample, by the film formation sequence according to the present embodiment, described with reference to FIG. 3. Here, processing conditions in each process were set to the same conditions as the conditions in the above-described embodiment. As the evaluation sample, the same plural samples as in example 1 were prepared. With respect to the SiC film in the plural evaluation samples, a wet etching evaluation using 1% HF solution was performed. As a result, it was confirmed that in the SiC film in any evaluation sample, resistance of a wet etching rate of 0.5 Å/min or lower was obtained.

Example 4

The SiC film was formed on the wafer 200 as an evaluation sample, by the film formation sequence according to the present embodiment, described with reference to FIG. 3. Here, processing conditions in each step were set to the same conditions as the conditions in the above-described embodiment. As the evaluation sample, the same plural samples as in Example 1 were prepared. With respect to the SiC film in the plural evaluation samples, a plasma oxidation was performed, and before and after the plasma oxidation, the densities of carbon (C), nitrogen (N) and oxygen (O) on the outermost surface of the SiC film were measured by XRF. As a result, it was confirmed that in the SiC film in any evaluation sample, the concentration of the C element was not changed, and resistance of a level at which the N element was substituted with the O element was obtained.

Comparative Example

The disilane gas and the triethylamine gas were alternately supplied with a purge in the processing chamber 201 being interposed therebetween so that the disilane gas and the triethylamine gas were not mixed in the processing chamber 201, without using the film formation sequence according to the present embodiment, to form an SiC film on the wafer 200 as an evaluation sample. Here, processing conditions in each step were set to the same conditions as the conditions in the above-described embodiment. As a result, in this comparative example, the SiC film formed on the wafer is excessively thin, and thus, the intensity measurement through XRF of the carbon (C) or nitrogen (N) in the SiC film as in Examples 1 and 2 could not be performed. Further, the resistance evaluation as in Examples 3 and 4 could not be performed.

From these example, it was found that in a case in which the disilane gas and the triethylamine gas were alternately supplied with the purge in the processing chamber 201 being interposed therebetween, the surface reaction was actively performed, but under the condition that the surface reaction was actively performed, it was difficult to form the SiC film. In the film formation through the thermal process in the low temperature region, it was found that it was necessary to perform the film formation under the condition that the gas phase reaction was actively performed as in the present embodiment.

(Preferred Aspects of the Present Invention)

Hereinafter, preferred aspects of the present invention will be added.

(Addition 1)

According to a first preferred aspect of the present invention, there is provided a semiconductor device manufacturing method including:

accommodating a substrate in a processing chamber; and
supplying a silicon-based gas and an amine-based gas into the processing chamber that is heated to form a film including silicon and carbon on the substrate, wherein
the forming of the film including silicon and carbon includes:
supplying the silicon-based gas and the amine-based gas into the processing chamber and confining the silicon-based gas and the amine-based gas in the processing chamber;
maintaining a state in which the silicon-based gas and the amine-based gas are confined in the processing chamber, and
exhausting an inside of the processing chamber.

(Addition 2)

In the semiconductor device manufacturing method according to Addition 1, preferably, in the forming of the film including silicon and carbon, the inside of the processing chamber is heated to reach a temperature at which at least one of the silicon-based gas and the amine-based gas is thermally decomposed.

(Addition 3)

In the semiconductor device manufacturing method according to Addition 1 or 2, preferably, the forming of the film including silicon and carbon is performed under an atmosphere without using plasma.

(Addition 4)

In the semiconductor device manufacturing method according to any one of Additions 1 to 3, preferably, in the forming of the film including silicon and carbon, alternately performing, predetermined times, the confining of the silicon-based gas and the amine-based gas in the processing chamber and the maintaining of the state in which the silicon-based gas and the amine-based gas are confined in the processing chamber, and the exhausting of the inside of the processing chamber are alternately performed predetermined times.

Here, the "alternately performing, the predetermined times, (A) the confining of the silicon-based gas and the amine-based gas in the processing chamber and (B) the maintaining of the state in which the silicon-based gas and the amine-based gas are confined in the processing chamber" includes, if a case in which (A) the confining of the silicon-based gas and the amine-based gas in the processing chamber and (B) the maintaining of the state in which the silicon-based gas and the amine-based gas are confined in the processing chamber are set as one cycle, both of a case in which the cycle is performed one time and a case in which the cycle is performed plural times (is repeated plural times), that is, that means that the cycle is performed one or more times (one time or plural times). Similarly, "the alternately performing, the predetermined times, (A) the confining of the silicon-based gas and the amine-based gas in the processing chamber and (B) the maintaining of the state in which the silicon-based gas and the amine-based gas are confined in the processing chamber, and (C) the exhausting of the inside of the processing chamber are alternately performed the predetermined times" includes, if a case in which the alternately performing, the predetermined times, (A) the confining of the silicon-based gas and the amine-based gas in the processing chamber and (B) the maintaining of the state in which the silicon-based gas and the amine-based gas are confined in the processing chamber, and (C) the exhausting of the inside of the processing chamber are set as one cycle, both of a case in which the cycle is performed one time and a case in which the cycle is performed plural times (is repeated plural times), that is, that means that the cycle is performed one or more times (one time or plural times).

(Addition 5)

In the semiconductor device manufacturing method according to any one of Additions 1 to 3, preferably, in the forming of the film including silicon and carbon, the confining of the silicon-based gas and the amine-based gas in the processing chamber, the maintaining of the state in which the silicon-based gas and the amine-based gas are confined in the processing chamber and the exhausting of the inside of the processing chamber are set as one cycle, and the cycle is repeated plural times.

(Addition 6)

In the semiconductor device manufacturing method according to any one of Additions 1 to 3, preferably, in the forming of the film including silicon and carbon, alternately repeating, plural times, the confining of the silicon-based gas and the amine-based gas in the processing chamber and the maintaining of the state in which the silicon-based gas and the amine-based gas are confined in the processing chamber, and the exhausting of the inside of the processing chamber are set as one cycle, and the cycle is repeated plural times.

(Addition 7)

In the semiconductor device manufacturing method according to any one of Additions 1 to 6, preferably, in the forming of the film including silicon and carbon, the silicon-based gas and the amine-based gas that are supplied into the processing chamber are thermally decomposed, substances generated by the thermal decomposition of the silicon-based gas and the amine-based gas are caused to react with each other and the film including silicon and carbon is formed by the reaction in a period when the silicon-based gas and the amine-based gas are confined in the processing chamber.

(Addition 8)

In the semiconductor device manufacturing method according to any one of Additions 1 to 7, preferably, the silicon-based gas is at least one type of gas among $Si_2H_6$ and $Si_3H_8$, and the amine-based gas is at least one type of gas among $(C_2H_5)_xNH_{3-x}$, $(C_3H_7)_xNH_{3-x}$, $(C_4H_9)_xNH_{3-x}$, $((CH_3)_2CH)_xNH_{3-x}$ and $((CH_3)_2CHCH_2)_xNH_{3-x}$ (here, x is an integer of 1 to 3).

(Addition 9)

In the semiconductor device manufacturing method according to any one of Additions 1 to 8, preferably, in the forming of the film including silicon and carbon, a temperature of the substrate is maintained from 350° C. to 450° C.

(Addition 10)

In the semiconductor device manufacturing method according to any one of Additions 1 to 9, preferably, in the forming of the film including silicon and carbon, an atomic concentration of carbon in the film including silicon and carbon is controlled according to a time when the state in which the silicon-based gas and the amine-based gas are confined in the processing chamber is maintained.

(Addition 11)

In the semiconductor device manufacturing method according to Addition 10, preferably, in the forming of the film including silicon and carbon, an atomic concentration of carbon in the film including silicon and carbon is controlled to become 1% to 40% according to a time when the state in which the silicon-based gas and the amine-based gas are confined in the processing chamber is maintained.

(Addition 12)

In the semiconductor device manufacturing method according to any one of Additions 1 to 9, preferably, in the maintaining of the state in which the silicon-based gas and the amine-based gas are confined in the processing chamber, the supply of the silicon-based gas and the amine-based gas into the processing chamber is stopped, and in the forming of the film including silicon and carbon, an atomic concentration of carbon in the film including silicon and carbon is controlled according to a time when the supply of the silicon-based gas and the amine-based gas is stopped.

(Addition 13)

In the semiconductor device manufacturing method according to Addition 12, preferably, in the forming of the film including silicon and carbon, an atomic concentration of carbon in the film including silicon and carbon is controlled to become 1% to 40% according to the time when the supply of the silicon-based gas and the amine-based gas is stopped.

(Addition 14)

In the semiconductor device manufacturing method according to any one of Additions 1 to 9, preferably, in the maintaining of the state in which the silicon-based gas and the amine-based gas are confined in the processing chamber, the supply of the silicon-based gas and the amine-based gas into the processing chamber is stopped, and in the forming of the film including silicon and carbon, an atomic concentration of carbon in the film including silicon and carbon is controlled according to a time when the supply of the silicon-based gas is stopped.

(Addition 15)

In the semiconductor device manufacturing method according to Addition 14, preferably, in the forming of the film including silicon and carbon, an atomic concentration of carbon in the film including silicon and carbon is controlled to become 1% to 40% according to the time when the supply of the silicon-based gas is stopped.

(Addition 16)

In the semiconductor device manufacturing method according to any one of Additions 1 to 15, preferably, in the confining of the silicon-based gas and the amine-based gas in the processing chamber and the maintaining of the state in which the silicon-based gas and the amine-based gas are confined in the processing chamber, the exhausting of the inside of the processing chamber is stopped.

(Addition 17)

In the semiconductor device manufacturing method according to any one of Additions 1 to 15, preferably, in the confining of the silicon-based gas and the amine-based gas in the processing chamber and the maintaining of the state in which the silicon-based gas and the amine-based gas are confined in the processing chamber, the silicon-based gas and the amine-based gas are exhausted from the processing chamber while being supplied into the processing chamber, and at this time, a state in which an exhaust rate of the silicon-based gas and the amine-based gas from the processing chamber is lower than a supply rate of the silicon-based gas and the amine-based gas into the processing chamber is maintained.

(Addition 18)

In the semiconductor device manufacturing method according to any one of Additions 1 to 17, preferably, the film including silicon and carbon includes a silicon carbide film (SiC film).

(Addition 19)

In the semiconductor device manufacturing method according to any one of Additions 1 to 17, preferably, the film including silicon and carbon includes at least one type of film among a silicon carbide film (SiC film) and a silicon carbonitride film (SiCN film).

(Addition 20)

In the semiconductor device manufacturing method according to any one of Additions 1 to 17, preferably, the forming of the film including silicon and carbon further includes supplying a nitrogen-containing gas and/or supplying an oxygen-containing gas, and at least one type of film among a silicon carbonitride film (SiCN film), a silicon oxycarbide film (SiOC film) and a silicon oxycarbonitride film (SiOCN film) is formed as the film including silicon and carbon.

(Addition 21)

In the semiconductor device manufacturing method according to any one of Additions 1 to 17, preferably, the forming of the film including silicon and carbon further includes supplying a nitrogen-containing gas, and a silicon carbonitride film (SiCN film) is formed as the film including silicon and carbon.

(Addition 22)

In the semiconductor device manufacturing method according to any one of Additions 1 to 17, preferably, the forming of the film including silicon and carbon further includes supplying an oxygen-containing gas, and at least one type of film among a silicon oxycarbide film (SiOC film) and a silicon oxycarbonitride film (SiOCN film) is formed as the film including silicon and carbon.

(Addition 23)

In the semiconductor device manufacturing method according to any one of Additions 1 to 17, preferably, the forming of the film including silicon and carbon further includes supplying a nitrogen-containing gas and supplying an oxygen-containing gas, and a silicon oxycarbonitride film (SiOCN film) is formed as the film including silicon and carbon.

(Addition 24)

According to another aspect of the present invention, there is provided a semiconductor device manufacturing method including:

accommodating a substrate in a processing chamber; and supplying a silicon-based gas and an amine-based gas into the processing chamber that is heated to form a film including silicon and carbon on the substrate, wherein the forming of the film including silicon and carbon includes:

exhausting the silicon-based gas and the amine-based gas from the processing chamber while supplying the silicon-based gas and the amine-based gas into the processing chamber and forming a state in which an exhaust rate of the silicon-based gas and the amine-based gas from the processing chamber is lower than a supply rate of the silicon-based gas and the amine-based gas into the processing chamber, maintaining the state, and exhausting an inside of the processing chamber.

(Addition 25)

According to still another aspect of the present invention, there is provided a substrate processing method including:

accommodating a substrate in a processing chamber; and supplying a silicon-based gas and an amine-based gas into the processing chamber that is heated to form a film including silicon and carbon on the substrate, wherein the forming of the film including silicon and carbon includes:

supplying the silicon-based gas and the amine-based gas into the processing chamber and confining the silicon-based gas and the amine-based gas in the processing chamber;

maintaining a state in which the silicon-based gas and the amine-based gas are confined in the processing chamber, and exhausting an inside of the processing chamber.

(Addition 26)

According to still another aspect of the present invention, there is provided a substrate processing apparatus including:

a processing chamber configured to accommodate a substrate;

a heater configured to heat an inside of the processing chamber;

a silicon-based gas supply system configured to supply a silicon-based gas into the processing chamber;

an amine-based gas supply system configured to supply an amine-based gas into the processing chamber;

an exhaust system configured to exhaust the inside of the processing chamber; and a control section configured to control the heater, the silicon-based gas supply system, the amine-based gas supply system and the exhaust system to perform a process of supplying the silicon-based gas and the amine-based gas into the processing chamber that accommodates the substrate and that is heated to form a film including silicon and carbon on the substrate, and at this time, to perform a process of supplying the silicon-based gas and the amine-based gas into the processing chamber and confining the silicon-based gas and the amine-based gas in the processing chamber, a process of maintaining a state in which the silicon-based gas and the amine-based gas are confined in the processing chamber, and a process of exhausting the inside of the processing chamber.

(Addition 27)

According to still another aspect of the present invention, there is provided a non-transitory computer-readable medium storing a program that causes a computer to perform a process including:

accommodating a substrate in a processing chamber of a substrate processing apparatus; and supplying a silicon-based gas and an amine-based gas into the processing chamber that is heated to form a film including silicon and carbon on the substrate, wherein in the forming of the film including silicon and carbon, supplying the silicon-based gas and the amine-based gas into the processing chamber and confining the silicon-based gas and the amine-based gas in the processing chamber, maintaining a state in which the silicon-based gas and the amine-based gas are confined in the processing chamber, and exhausting an inside of the processing chamber are executed.

Hereinbefore, the variety of typical embodiments of the present invention have been described, but the present invention is not limited to these embodiments.

For example, in the above-described embodiments, in process A and process B, an example has been described in which both of the silicon-based gas and the amine-based gas are thermally decomposed, but at least any one of the silicon-based gas and the amine-based gas may be thermally decomposed. For example, only the silicon-based gas may be thermally decomposed, or only the amine-based gas may be thermally decomposed. Here, in consideration of reaction efficiency, it is more preferable that both of the silicon-based gas and the amine-based gas be thermally decomposed.

Further, for example, in the above-described embodiments, in process B, an example has been described in which the supply of the silicon-based gas and the amine-based gas is stopped, but in process B, an inert gas such as $N_2$ may continuously flow in each nozzle. In this case, the pressure in the processing chamber is increased as the inert gas is supplied into the processing chamber, but the flow rate of the inert gas supplied into each nozzle is controlled so that the pressure in the processing chamber does not exceed a processing pressure, that is, a desired pressure in the range of 100 Pa to 2000 Pa. In process B, as the inert gas continuously flows in each nozzle, it is possible to prevent a film including silicon or carbon from being formed in each nozzle.

Further, for example, in the above-described embodiment, an example in which the processing chamber of a single reaction tube structure has been described, but the present invention is not limited thereto, and may be preferably applied to a case in which a processing chamber of a double reaction tube structure is used. In this case, the reaction tube is configured by an outer tube (outer reaction tube) and an internal tube (internal reaction tube) that is installed inside the outer tube, and the silicon-based gas and the amine-based gas flow into the processing chamber formed in a hollow part in the internal tube toward an upper end side of the internal tube from a lower end side thereof, for example, flow out to a cylindrical space between the internal tube and the outer tube from the upper end side of the internal tube, and flow down in the cylindrical space to be then exhausted from the exhaust pipe. In this case, in a similar way to the above-described embodiment, by adjusting the opening level of the APC valve installed in the exhaust pipe, the above-mentioned confined state is formed and maintained. In this way, by using the processing chamber of the double reaction tube structure, it is possible to form an SiC-based film having excellent flatness and film thickness uniformity.

Further, for example, in the above-described embodiment, an example in which a ladder boat (boat of a type in which engaging grooves are formed in a boat support) is used as the substrate support tool that supports the substrate has been described, but the present invention is not limited thereto, and may be preferably applied to a case in which a ring boat is used. In this case, for example, the ring boat may include three or four boat supports that are installed at appropriate intervals in a circumferential direction, and a ring-shaped holder as a support plate that is horizontally installed to the boat supports at multi stages and supports the outer circumference of the substrate from the rear surface. In this case, the ring-shaped holder may include a ring-shaped plate that has an outer diameter larger than the diameter of the substrate and an inner diameter smaller than the diameter of the substrate, and plural substrate holding hooks that are installed at appropriate intervals in the circumferential direction on the ring-shaped plate and hold an outer circumferential rear surface of the substrate. Further, in this case, the ring-shaped holder may include a ring-shaped plate that has an outer diameter and an inner diameter larger than the diameter of the substrate, and plural substrate holding hooks that are installed at appropriate intervals in the circumferential direction on the inner side of the ring-shaped plate and hold an outer circumferential rear surface of the substrate. Compared with a case in which the ring-shaped plate is not present, since the distance to a separated region (in this case, region divided in the ring-shaped plate) for each substrate from the hole of each nozzle is shortened as the ring-shaped plate is present, the gas ejected from each nozzle is easily transported to the substrate region. Thus, it is possible to sufficiently secure the gas supply amount to the substrate, and to prevent reduction in the film formation speed or deterioration of uniformity. By using the ring-holder, it is possible to form an SiC-based film having excellent flatness and film thickness uniformity.

Further, in the above-described embodiments, an example has been described in which the silicon-based insulation film (SiC film, SiCN film, SiOCN film and SiOC film) including silicon that is a semiconductor element is formed, but the invention may also be applied to a case in which a metal-based thin film including a metallic element such as titanium (Ti), zirconium (Zr), hafnium (Hf), tantalum (Ta), aluminum (Al) or molybdenum (Mo) is formed.

For example, the invention may also be preferably applied to a case in which a metal carbide film such as a titanium carbide film (TiC film), a zirconium carbide film (ZrC film), a hafnium carbide film (HfC film), a tantalum carbide film (TaC film), an aluminum carbide film (AlC film) or a molybdenum carbide film (MoC film) is formed.

Further, for example, the invention may also be preferably applied to a case in which a metal carbonitride film such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film) or a molybdenum carbonitride film (MoCN film) is formed.

Further, for example, the invention may also be preferably applied to a case in which a metal oxycarbonitride film such as a titanium oxycarbonitride film (TiOCN film), a zirconium oxycarbonitride film (ZrOCN film), a hafnium oxycarbonitride film (HfOCN film), a tantalum oxycarbonitride film (TaOCN film), an aluminum oxycarbonitride film (AlOCN film) or a molybdenum oxycarbonitride film (MoOCN film) is formed.

Further, for example, the invention may also be preferably applied to a case in which a metal oxycarbide film such as a titanium oxycarbide film (TiOC film), a zirconium oxycarbide film (ZrOC film), a hafnium oxycarbide film (HfOC film), a tantalum oxycarbide film (TaOC film), an aluminum oxycarbide film (AlOC film) or a molybdenum oxycarbide film (MoOC film) is formed.

In this case, it is possible to perform the film formation by the same sequence as in the above-described embodiments, using a metal-based source gas including a metallic element, instead of the silicon-based gas in the above-described embodiments.

For example, in a case in which a metal-based thin film including Ti (TiC film, TiCN film, TiOCN film or TiOC film) is formed, a Ti-based source gas such as titanium tetrachloride ($TiCl_4$) or titanium tetrafluoride ($TiF_4$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

For example, in a case in which a metal-based thin film including Zr (ZrC film, ZrCN film, ZrOCN film or ZrOC film) is formed, a Zr-based source gas such as zirconium tetrachloride ($ZrCl_4$) or zirconium tetrafluoride ($ZrF_4$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

For example, in a case in which a metal-based thin film including Hf (HfC film, HfCN film, HfOCN film or HfOC film) is formed, a Hf-based source gas such as hafnium tetrachloride ($HfCl_4$) or t hafnium tetrafluoride ($HfF_4$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

For example, in a case in which a metal-based thin film including Ta (TaC film, TaCN film, TaOCN film or TaOC film) is formed, a Ta-based source gas such as tantalum pentachloride ($TaCl_5$) or tantalum pentafluoride ($TiF_5$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

For example, in a case in which a metal-based thin film including Al (AlC film, AlCN film, AlOCN film or AlOC film) is formed, a Al-based source gas such as aluminum trichloride ($AlCl_3$) or aluminum trifluoride ($AlF_3$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

For example, in a case in which a metal-based thin film including Mo (MoC film, MoCN film, MoOCN film or MoOC film) is formed, a Mo-based source gas such as molybdenum pentachloride ($MoCl_5$) or molybdenum pentafluoride ($MoF_5$) may be used as a source gas. As the amine-based gas, the nitrogen-containing gas and the oxygen-containing gas, the same gases as in the above-described embodiments may be used. In this case, the processing condition may be the same as the processing condition of the above-described embodiments.

That is, the present invention may be preferably applied to a case in which a thin film including a predetermined element such as a semiconductor element or a metallic element is formed.

Further, for example, in the above-described embodiments, an example has been described in which the film is formed using a batch substrate processing apparatus that processes plural substrates at a time, but the present invention is not limited thereto. That is, the invention may also be preferably applied to a case in which the film is formed using a single substrate processing apparatus that processes one sheet of substrate or several sheets of substrates at a time.

Further, the respective film formation examples or application examples of the above-described embodiments may be preferably used in combination.

Further, for example, the present invention may also be realized when a process recipe of the existing substrate processing apparatus is changed. In a case in which the process recipe is changed, a process recipe according to the present invention may be installed to the existing substrate processing apparatus through an electric communication line or a recording medium that records the process recipe according to the present invention, and the process recipe of the existing substrate processing apparatus may be changed to the process recipe according to the present invention by operating an input and output device of the existing substrate processing apparatus.

Thus, the scope of the present invention is limited by only the following claims.

What is claimed is:

1. A semiconductor device manufacturing method comprising:
    accommodating a substrate in a processing chamber; and
    supplying a silicon-based gas and an amine-based gas into the processing chamber that is heated to form a film including silicon and carbon on the substrate, wherein;
    (i) the forming of the film including silicon and carbon includes:
        supplying the silicon-based gas and the amine-based gas into the processing chamber and confining the silicon-based gas and the amine-based gas in the processing chamber;
        maintaining a state in which the silicon-based gas and the amine-based gas are confined in the processing chamber, and
        exhausting an inside of the processing chamber; and
    (ii) in the forming of the film including silicon and carbon, an atomic concentration of carbon in the film including silicon and carbon is controlled according to a time when the state in which the silicon-based gas and the amine-based gas are confined in the processing chamber is maintained.

2. The semiconductor device manufacturing method according to claim 1, wherein in the forming of the film including silicon and carbon, the inside of the processing chamber is heated to reach a temperature at which at least one of the silicon-based gas and the amine-based gas is thermally decomposed.

3. The semiconductor device manufacturing method according to claim 1, wherein the forming of the film including silicon and carbon is performed under an atmosphere without using plasma.

4. The semiconductor device manufacturing method according to claim 1, wherein, in the forming of the film including silicon and carbon, alternately performing, predetermined times, the confining of the silicon-based gas and the amine-based gas in the processing chamber and the maintaining of the state in which the silicon-based gas and the amine-based gas are confined in the processing chamber, and the exhausting of the inside of the processing chamber are alternately performed predetermined times.

5. The semiconductor device manufacturing method according to claim 1, wherein, in the forming of the film including silicon and carbon, the confining of the silicon-based gas and the amine-based gas in the processing chamber, the maintaining of the state in which the silicon-based gas and the amine-based gas are confined in the processing chamber and the exhausting of the inside of the processing chamber are set as one cycle, and the cycle is repeated plural times.

6. The semiconductor device manufacturing method according to claim 1, wherein, in the forming of the film including silicon and carbon, alternately repeating, plural times, the confining of the silicon-based gas and the amine-based gas in the processing chamber and the maintaining of the state in which the silicon-based gas and the amine-based gas are confined in the processing chamber, and the exhausting of the inside of the processing chamber are set as one cycle, and the cycle is repeated plural times.

7. The semiconductor device manufacturing method according to claim 1, wherein, in the forming of the film including silicon and carbon, the silicon-based gas and the amine-based gas that are supplied into the processing chamber are thermally decomposed, substances generated by the thermal decomposition of the silicon-based gas and the amine-based gas are caused to react with each other, and the film including silicon and carbon is formed by the reaction in a period when the silicon-based gas and the amine-based gas are confined in the processing chamber.

8. The semiconductor device manufacturing method according to claim 1, wherein the silicon-based gas is at least one type of gas selected from the group consisting of $Si_2H_6$ and $Si_3H_8$, and the amine-based gas is at least one type of gas selected from the group consisting of $(C_2H_5)_xNH_{3-x}$, $(C_3H_7)_xNH_{3-x}$, $(C_4H_9)_xNH_{3-x}$, $((CH_3)_2CH)_xNH_{3-x}$ and $((CH_3)_2CHCH_2)_xNH_{3-x}$ (here, x is an integer of 1 to 3).

9. The semiconductor device manufacturing method according to claim 1, wherein, in the forming of the film including silicon and carbon, a temperature of the substrate is maintained from 350° C. to 450° C.

10. The semiconductor device manufacturing method according to claim 1, wherein, in the confining of the silicon-based gas and the amine-based gas in the processing chamber and the maintaining of the state in which the silicon-based gas and the amine-based gas are confined in the processing chamber, the exhausting of the inside of the processing chamber is stopped.

11. The semiconductor device manufacturing method according to claim 1, wherein, in the confining of the silicon-based gas and the amine-based gas in the processing chamber and the maintaining of the state in which the silicon-based gas and the amine-based gas are confined in the processing chamber, the silicon-based gas and the amine-based gas are exhausted from the processing chamber while being supplied into the processing chamber, and at this time, a state in which an exhaust rate of the silicon-based gas and the amine-based gas from the processing chamber is lower than a supply rate of the silicon-based gas and the amine-based gas into the processing chamber is maintained.

12. The semiconductor device manufacturing method according to claim 1, wherein, the film including silicon and carbon includes a silicon carbide film.

13. The semiconductor device manufacturing method according to claim 1, wherein, the film including silicon and carbon includes at least one type of film selected from the group consisting of a silicon carbide film and a silicon carbonitride film.

14. The semiconductor device manufacturing method according to claim 1, wherein, the forming of the film including silicon and carbon further includes supplying a nitrogen-containing gas and/or supplying an oxygen-containing gas, and at least one type of film selected from the group consisting of a silicon carbonitride film, a silicon oxycarbide film and a silicon oxycarbonitride film is formed as the film including silicon and carbon.

15. A substrate processing method comprising:
accommodating a substrate in a processing chamber; and
supplying a silicon-based gas and an amine-based gas into the processing chamber that is heated to form a film including silicon and carbon on the substrate, wherein:
(i) the forming of the film including silicon and carbon includes:
supplying the silicon-based gas and the amine-based gas into the processing chamber and confining the silicon-based gas and the amine-based gas in the processing chamber;
maintaining a state in which the silicon-based gas and the amine-based gas are confined in the processing chamber, and
exhausting an inside of the processing chamber; and
(ii) in the forming of the film including silicon and carbon, an atomic concentration of carbon in the film including silicon and carbon is controlled according to a time when the state in which the silicon-based gas and the amine-based gas are confined in the processing chamber is maintained.

16. A non-transitory computer-readable medium storing a program that causes a computer to perform a process comprising:
accommodating a substrate in a processing chamber of a substrate processing apparatus; and
supplying a silicon-based gas and an amine-based gas into the processing chamber that is heated to form a film including silicon and carbon on the substrate, wherein;
(i) in the forming of the film including silicon and carbon, supplying the silicon-based gas and the amine-based gas into the processing chamber and confining the silicon-based gas and the amine-based gas in the processing chamber, maintaining a state in which the silicon-based gas and the amine-based gas are confined in the processing chamber, and exhausting an inside of the processing chamber are executed, and
(ii) in the forming of the film including silicon and carbon, an atomic concentration of carbon in the film including silicon and carbon is controlled according to a time when the state in which the silicon-based gas and the amine-based gas are confined in the processing chamber is maintained.

* * * * *